(12) United States Patent
Kim et al.

(10) Patent No.: US 10,755,647 B2
(45) Date of Patent: Aug. 25, 2020

(54) ORGANIC LIGHT EMITTING DISPLAY DEVICE

(71) Applicant: Samsung Display Co., Ltd., Yongin-si, Gyeonggi-do (KR)

(72) Inventors: Sung Hwan Kim, Osan-si (KR); Cheol Min Kim, Seongnam-si (KR); Sung Hoon Bang, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 16/131,858

(22) Filed: Sep. 14, 2018

(65) Prior Publication Data

US 2019/0096335 A1 Mar. 28, 2019

(30) Foreign Application Priority Data

Sep. 27, 2017 (KR) .................. 10-2017-0125251

(51) Int. Cl.
*G09G 3/3291* (2016.01)
*G09G 3/3266* (2016.01)
(Continued)

(52) U.S. Cl.
CPC ......... *G09G 3/3291* (2013.01); *G09G 3/3233* (2013.01); *G09G 3/3258* (2013.01); *G09G 3/3266* (2013.01); *G09G 3/3275* (2013.01); *H01L 27/3276* (2013.01); *G09G 2300/0426* (2013.01); *G09G 2300/0814* (2013.01); *G09G 2300/0819* (2013.01); *G09G 2310/08* (2013.01); *G09G 2320/0223* (2013.01);
(Continued)

(58) Field of Classification Search
CPC .............. G06F 3/0412; G06F 3/041; G09G 2300/0809; G09G 3/3233; G09G 3/3225; G09G 3/3258; G09G 3/3208
See application file for complete search history.

(56) References Cited

U.S. PATENT DOCUMENTS 8,334,825 B2 12/2012 Kim
2012/0299978 A1* 11/2012 Chaji .................. G09G 3/006
345/690

(Continued)

FOREIGN PATENT DOCUMENTS

KR 10-2016-0043594 4/2016
KR 10-2016-0096275 8/2016

*Primary Examiner* — Sanjiv D. Patel
(74) *Attorney, Agent, or Firm* — Lewis Roca Rothgerber Christie LLP

(57) ABSTRACT

An organic light emitting display device includes a driving transistor having one electrode connected with a node, and another electrode connected with an organic light emitting element, a first control transistor for receiving a first driving voltage through one electrode, and having another electrode connected with the node, a second control transistor for receiving a second driving voltage through one electrode, and having another electrode connected with the node, and a sensing transistor having one electrode connected between the another electrode of the driving transistor and the organic light emitting element, wherein the sensing transistor is turned on in a sensing period, the first control transistor is turned off in the sensing period, and the second control transistor is turned on in the sensing period.

14 Claims, 24 Drawing Sheets

(51) Int. Cl.
*G09G 3/3233* (2016.01)
*H01L 27/32* (2006.01)
*G09G 3/3258* (2016.01)
*G09G 3/3275* (2016.01)

(52) U.S. Cl.
CPC .............. *G09G 2320/0295* (2013.01); *G09G 2320/045* (2013.01); *G09G 2330/00* (2013.01)

(56) References Cited

U.S. PATENT DOCUMENTS

| | | | |
|---|---|---|---|
| 2014/0160093 A1* | 6/2014 | Chaji | G09G 3/3258 345/204 |
| 2014/0333680 A1* | 11/2014 | Choi | G09G 3/3233 345/690 |
| 2016/0063921 A1* | 3/2016 | Tsai | G09G 3/3233 345/76 |
| 2016/0104419 A1* | 4/2016 | Chung | G09G 3/3225 345/78 |
| 2017/0061877 A1* | 3/2017 | Lee | G09G 3/3233 |
| 2017/0162122 A1* | 6/2017 | In | G09G 3/3266 |
| 2017/0249882 A1* | 8/2017 | Lee | G09G 3/006 |

* cited by examiner (a)

(b)

ORGANIC LIGHT EMITTING DISPLAY DEVICE

CROSS-REFERENCE TO RELATED APPLICATION

This application claims priority to, and the benefit of, Korean Patent Application No. 10-2017-0125251, filed on Sep. 27, 2017, which is hereby incorporated by reference for all purposes as if fully set forth herein.

BACKGROUND

1. Field

Embodiments of the present invention relates to an organic light emitting display device.

2. Description of the Related Art

The importance of a display device has increased with the development of multimedia. Accordingly, various types of display devices, such as a liquid crystal display (LCD) and an organic light-emitting display (OLED), have been used.

Among display devices, an organic light emitting display device displays an image using an organic light emitting element that emits light by recombination of electrons and holes. The organic light emitting display device has a high response speed, high luminance, and a wide viewing angle, and is driven at low power consumption.

SUMMARY

An aspect of embodiments of the present invention is to provide an organic light emitting display device that can measure hysteresis characteristics in real time.

Another aspect of embodiments of the present invention is to provide an organic light emitting display device that can improve the accuracy of hysteresis characteristics while resisting a voltage drop.

According to an exemplary embodiment of the present disclosure, there is provided an organic light emitting display device including a driving transistor having one electrode connected with a node, and another electrode connected with an organic light emitting element, a first control transistor for receiving a first driving voltage through one electrode, and having another electrode connected with the node, a second control transistor for receiving a second driving voltage through one electrode, and having another electrode connected with the node, and a sensing transistor having one electrode connected between the another electrode of the driving transistor and the organic light emitting element, wherein the sensing transistor is turned on in a sensing period, the first control transistor is turned off in the sensing period, and the second control transistor is turned on in the sensing period.

The organic light emitting display device may further include a third control transistor having one electrode connected with the another electrode of the driving transistor, and another electrode connected with the organic light emitting element, and configured to be turned on in the sensing period.

A gate electrode of the sensing transistor and a gate electrode of the second control transistor may be configured to receive a same sensing signal.

The organic light emitting display device may further include a scan transistor having one electrode connected with a data line, a gate electrode connected with a scan line, and another electrode connected with the driving transistor.

Another electrode of the sensing transistor may be connected with the data line.

The scan transistor may be configured to be turned on in a first period and in a second period subsequent to the first period during one frame, and the sensing period may be between the first period and the second period.

The another electrode of the scan transistor may be connected with the node.

The organic light emitting display device may further include a compensation transistor having one electrode connected with the driving transistor, another electrode connected with the gate electrode of the driving transistor, and a gate electrode connected with the gate electrode of the scan transistor.

According to an exemplary embodiment of the present disclosure, there is provided an organic light emitting display device including a display unit in which a first pixel including a driving transistor, a first control transistor, a second control transistor, a sensing transistor, and an organic light emitting element is located, and a power supply unit connected with a first driving voltage line connected to one electrode of the first control transistor, and a second driving voltage connected to another electrode of the second control transistor, wherein the driving transistor has one electrode connected with a node, and another electrode connected with the organic light emitting element, wherein another electrode of the first control transistor and another electrode of the second control transistor are connected with the node, and wherein the sensing transistor and the second control transistor are configured to be turned on, and the first control transistor is configured to be turned off, in a sensing period.

The sensing transistor may perform a switching operation in the same manner as the second control transistor.

The display unit may further include a scan transistor having one electrode connected with a data line, another electrode connected with the node, and a gate electrode connected with a scan line.

The scan transistor may be configured to be turned on in a first period and in a second period subsequent to the first period during one frame, and the sensing period may be between the first period and the second period.

The sensing period may be in an active section in which an image is displayed in the one frame.

A data signal may be provided to the one electrode of the scan transistor through the data line during the first period is different from a data signal provided to the one electrode of the scan transistor through the data line during the second period.

The organic light emitting display device may further include a data driver connected with one electrode of the scan transistor through the data line, wherein the sensing transistor has one electrode connected with the data line, and another electrode connected with another electrode of the driving transistor.

According to an exemplary embodiment of the present disclosure, there is provided an organic light emitting display device including a scan transistor having one electrode connected with a data line, another electrode connected with a node, and a gate electrode connected with a scan line, a driving transistor having one electrode connected with the node and another electrode connected with an organic light emitting element, a first control transistor receiving a first driving voltage through one electrode, and having another electrode connected with the node, a second control transistor receiving a second driving voltage through one electrode, and having another electrode connected with the node, and a sensing transistor having one electrode connected with the data line, and another electrode connected with the organic light emitting element, wherein the sensing transistor is configured to perform a switching operation complementarily with the first control transistor in a sensing period, and is configured to perform the switching operation in the same manner as the second control transistor.

The scan transistor may be turned on in a first period and a second period subsequent to the first period, wherein the sensing period is between the first period and the second period, and wherein the sensing period, the first period, and the second period are included in one frame.

The first control transistor may be configured to be turned off three times during one frame, and the second control transistor is configured to be turned off two times during one frame.

The sensing period may be in an active section in which an image is displayed in one frame.

The organic light emitting display device may further include a third control transistor having one electrode connected with another electrode of the driving transistor, and another electrode connected with the organic light emitting element, the third control transistor being configured to be turned on in the sensing period.

BRIEF DESCRIPTION OF THE DRAWINGS

The above and other aspects of embodiments of the present invention will become more apparent by describing in detail exemplary embodiments thereof with reference to the attached drawings, in which.

DETAILED DESCRIPTION

Figure 1:
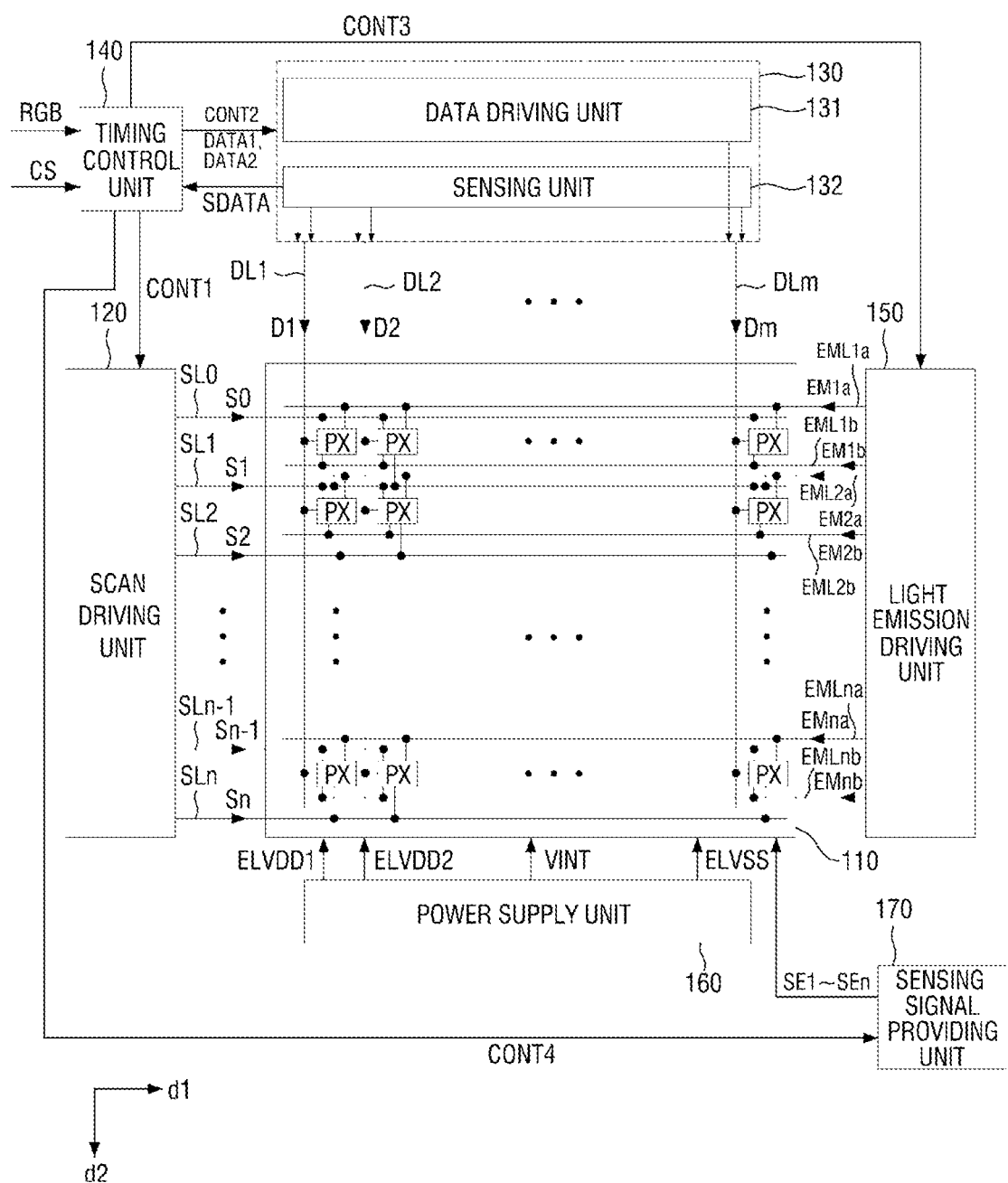
FIG. 1 is a block diagram schematically illustrating an organic light emitting display device according to an embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, third, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure. Thus, a first element, component, region, layer or section described below could be termed a second element, component, region, layer or section, without departing from the spirit and scope of the present invention.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, embodiments of the present invention will be described with reference to the attached drawings.

FIG. 1 is a block diagram schematically illustrating an organic light emitting display device according to an embodiment of the present invention.

Referring to FIG. 1, the organic light emitting display device according to an embodiment of the present invention may include a display unit 110, a scan driver 120, a data driver 130, a timing controller 140, a light emission driver 150, a power supply unit 160, and a sensing signal provider 170.

The display unit 110 may include an area for displaying an image. A plurality of pixels PX is arranged in the display unit 110. The display unit 110 may be connected with 1st to n-th scan lines SL1 to SLn (n is a natural number of 1 or more) extending in a first direction d1, and 1st to m-th data lines DL1 to DLm (m is a natural number of 1 or more). The plurality of pixels PX may be connected with 1a-st to na-th light emission control lines EML1a to EMLna and 1b-st to nb-th light emission control lines EML1b to EMLnb extending in a direction opposite to the first direction d1. Here, in an embodiment, the first direction d1 may cross the second direction d2. Referring to FIG. 1, the first direction d1 is exemplified as a row direction, and the second direction d2 is exemplified as a column direction. Meanwhile, the extending directions of the scan lines, data lines, and light emission control lines shown in FIG. 1 are exemplified as an example, and are not particularly limited as long as the lines are insulated from each other.

The connection relationship between the plurality of pixels PX and the scan lines, data lines, and light emission control lines shown in FIG. 1 will be described in more detail.

In an embodiment, each of the plurality of pixels may be electrically connected with two scan lines of the 1st to n-th scan lines SL1 to SLn. For example, each of the plurality of pixels may be electrically connected with a scan line located in a row where the corresponding pixel is located, and a scan line located in the previous row. Meanwhile, pixels PX in a first row may be connected with not only the first scan line SL1, but also with a scan line in a row that is previous to the row in which the first scan line SL1 is located, that is, also with a dummy scan line SL0. Hereinafter, the 1st to n-th scan lines SL1 to SLn and the dummy scan line SL0 are collectively referred to as a plurality of scan lines SL0 to SLn.

The scan driver 120 may be electrically connected to the plurality of pixels PX through the plurality of scan lines SL0 to SLn. More specifically, the scan driver 120 may generate the plurality of scan signals S0 to Sn based on a first control signal CONT1 provided from the timing controller 140. The scan driver 120 may provide the generated plurality of scan signals S0 to Sn to the plurality of pixels PX through the plurality of scan lines SL0 to SLn.

The data driver 130 may include a data driving unit 131 and a sensing unit 132.

The data driving unit 131 may be electrically connected with the plurality of pixels PX through the 1st to m-th data lines DL1 to DLm. The data driving unit 131 may receive a second control signal CONT2, a first video data DATA1, and a second video data DATA2 from the timing controller 140. The data driving unit 131 may generate first to m-th data signals D1 to Dm to be provided to the pixels PX through the 1st to m-th data lines DL1 to DLm based on the second control signal CONT2, the first video data DATA1, and the second video data DATA2. In an embodiment, the data driving unit 131 may include a shift register, a latch, and a digital-analog conversion unit.

The sensing unit 132 may be electrically connected with the plurality of pixels PX through the first to m-th data lines DL1 to DLm. The sensing unit 132 may measure hysteresis characteristics of one of the pixels PX located in an area where hysteresis measurement is suitable. Hereinafter, the area where hysteresis measurement is suitable is defined as a hysteresis area. The number of the pixels included in the hysteresis area is not particularly limited. In an embodiment, the hysteresis region may include one pixel. Hereinafter, a case where one pixel is included in the hysteresis area will be described as an example.

The sensing unit 132 may convert the measured hysteresis into sensing data SDATA, and then provide the sensing data SDATA to the timing controller 140. As described above, each of the data driving unit 131 and the sensing unit 132 may be electrically connected with the plurality of pixels PX through the first to m-th data lines DL1 to DLm. For this purpose, the data driver 130 may further include a switch bank 133 (refer to FIG. 3) for selectively connecting one of the data driving unit 131 and the sensing unit 132 to the first to m-th data lines DL1 to DLm. When the first to m-th data signals D1 to Dm are connected to the plurality of pixels PX, the switch bank 133 may electrically connect the data driving unit 131 and the plurality of pixels PX through a switching operation. In contrast, when hysteresis measurement of the hysteresis area is suitable, the switch bank 133 may electrically connect the sensing unit 132 and the plurality of pixels PX through the switching operation.

The timing controller 140 may receive an externally provided video signal RGB and an externally provided control signal CS. The video signal RGB may include a plurality of gradation data to be provided to the plurality of pixels PX. In an embodiment, the control signal CS may include a horizontal synchronization signal, a vertical synchronization signal, and a main clock signal. The horizontal synchronization signal indicates the time taken to display one line of the display unit 110. The vertical synchronization signal indicates the time taken to display an image of one frame. The main clock signal is a signal used as a reference for generating various signals of the timing controller 140 in synchronization with each of the scan driver 120 and the data driving unit 131.

The timing controller 140 processes the video signal RGB and the control signal CS in accordance with the operation conditions of the display unit 110 to generate the first video data DATA1, the second video data DATA2, the first control signal CONT1, and the second control signal CONT2, as well as a third control signal CONT3 and a fourth control signal CONT4, which are discussed further below.

In an embodiment, the timing controller 140 may determine a hysteresis area based on the video signal RGB. The timing controller 140 may adjust a data signal, a scan signal, a sensing signal, and a light emission control signal provided in the hysteresis area to measure the hysteresis of the hysteresis area. Details thereof will be described later.

The sensing unit 132 may convert the measured hysteresis to sensing data SDATA, and may provide the sensing data SDATA to the timing controller 140. The timing controller 140 may generate compensation data based on the sensing data SDATA, and may provide the compensation data to the data driving unit 131. Here, the compensation data is defined as data in which hysteresis is compensated.

The light emission driver 150 may be connected with the plurality of pixels PX through the 1a-st to na-th light emission control lines EML1a to EMLna and the 1b-st to nb-th light emission control lines EML1b to EMLnb. The light emission driver 150 may generate light emission control signals EM1a to EMna and EM1b to EMnb to be respectively provided the 1a-st to na-th light emission control lines EML1a to EMLna and the 1b-st to nb-th light emission control lines EML1b to EMLnb based on the third control signal CONT3 received from the timing controller 140. The light emission driver 150 may provide the generated light emission control signals through the 1a-st to na-th light emission control lines EML1a to EMLna and 1b-st to nb-th light emission control lines EML1b to EMLnb to the plurality of pixels PX.

The power supply unit 160 may supply a first driving voltage ELVDD1, a second driving voltage ELVDD2, a third driving voltage ELVSS, and an initialization voltage VINT to the plurality of pixels PX. In an embodiment, the first driving voltage ELVDD1 and the second driving voltage ELVDD2 may have a higher voltage level than the third driving voltage ELVSS. Meanwhile, in an embodiment, the first driving voltage ELVDD1 and the second driving voltage ELVDD2 may have the same voltage level. However, in another embodiment, if the second driving voltage ELVDD2 has a voltage level that is sufficient to perform the hysteresis measurement of a first transistor (e.g., a driving transistor) T1 (refer to FIG. 2), which is to be described later, the voltage levels of the first driving voltage ELVDD1 and the second driving voltage ELVDD2 may be different from each other.

The sensing signal provider 170 may provide 1st to n-th sensing signals SE1 to SEn to the display unit 110. More specifically, the sensing signal provider 170 may be connected with the display unit 110 through 1st to n-th sensing lines (not shown). That is, one sensing line may be electrically connected with one pixel row. In another embodiment, the plurality of sensing lines may be connected with each of the plurality of pixels PX.

The sensing signal provider 170 may generate the 1st to the n-th sensing signals SE1 to SEn based on the fourth control signal CONT4 received from the timing controller 140. The sensing signal provider 170 may measure the hysteresis of the hysteresis area by providing the sensing signals to a pixel corresponding to the hysteresis area. In an embodiment, the sensing signal provider 170 may be connected with each of the plurality of pixels PX through the plurality of sensing lines. That is, the plurality of pixels PX may be connected one-to-one with the plurality of sensing lines. In another embodiment, the plurality of sensing lines may be connected with the plurality of pixels PX for each row. In this case, when the sensing signals are provided to a pixel determined as, or corresponding to, the hysteresis area, the sensing signals may also be provided to other pixels located on the same row as the pixel of the hysteresis area.

In an embodiment, the sensing signal provider 170 may be an integrated circuit (IC). In another embodiment, the sensing signal provider 170 may be included in the timing controller 140 or in the data driver 130.

Next, the plurality of pixels PX will be described in more detail with reference to FIG. 2. Hereinafter, a k-th pixel PXk of the plurality of pixels PX will be described as a reference. Here, the k-th pixel PXk is defined as a pixel that receives an i-th scan signal Si (i is a natural number of 1 or more), an i−1-th scan signal Si−1, a k-th data signal Dk (k is a natural number of 1 or more), an ia-th light emission control signal EMia, an ib-th light emission control signal EMib, and an i-th sensing signal SEi.

Figure 2:
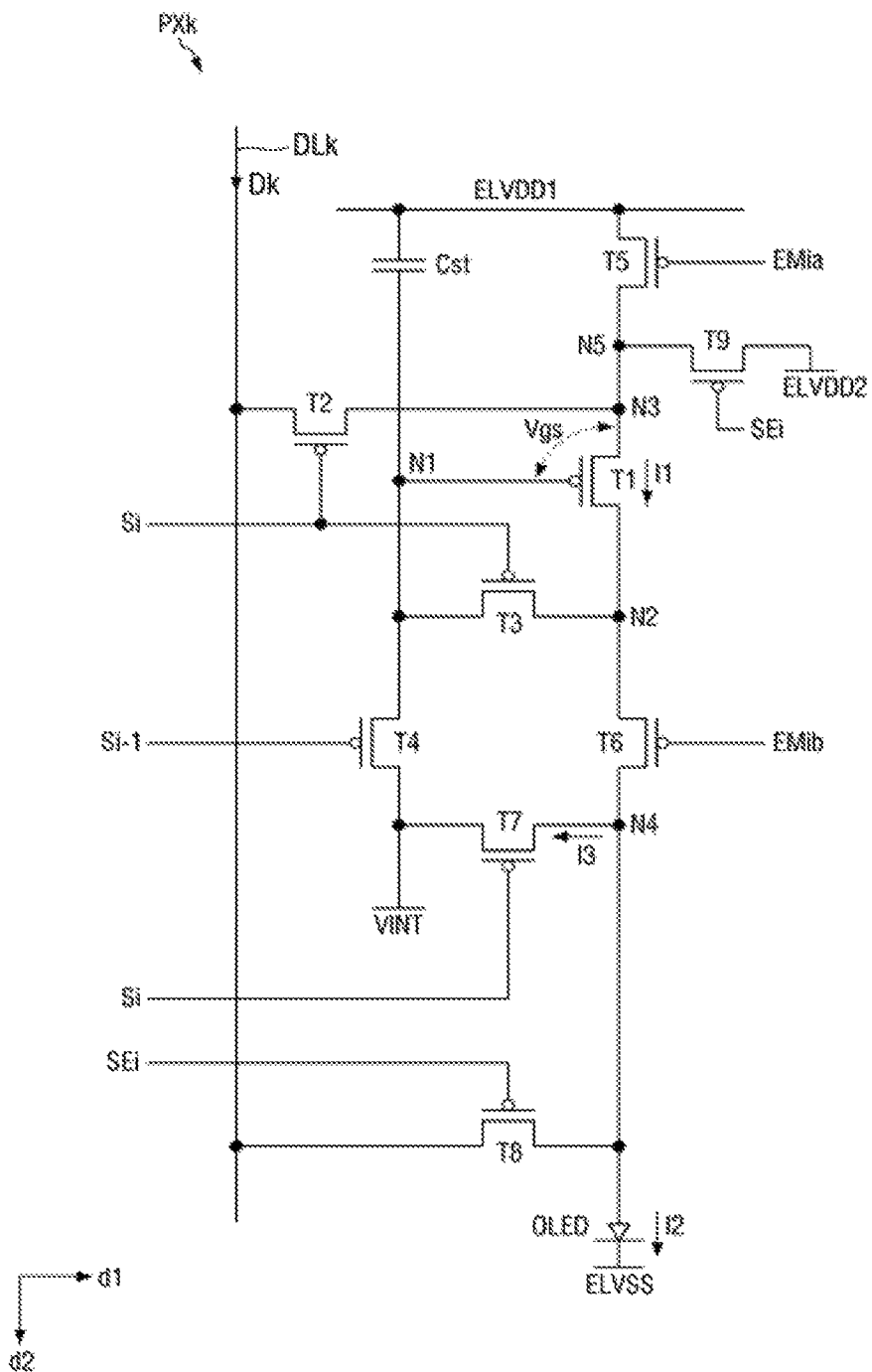
FIG. 2 is an equivalent circuit diagram of a k-th pixel of the plurality of pixels shown in FIG. 1.

FIG. 2 is an equivalent circuit diagram of the k-th pixel of the plurality of pixels shown in FIG. 1.

Referring to FIG. 2, the k-th pixel PXk may include first to ninth transistors T1 to T9, a storage capacitor Cst, and an organic light emitting diode OLED. Each of the first to ninth transistors T1 to T9 may include a control electrode, an input electrode, and an output electrode. Hereinafter, the control electrode will be referred to as a gate electrode, the input electrode will be referred to as a source electrode, and the output electrode will be referred to as a drain electrode. Meanwhile, in an embodiment, the first to ninth transistors T1 to T9 may be PMOS transistors. However, the present invention is not limited thereto, and the first to ninth transistors T1 to T9 may be NMOS transistors.

The first transistor T1 may include a gate electrode connected to a first node N1, a source electrode connected to a third node N3, and a drain electrode connected to a second node N2. The second transistor (e.g., a scan transistor) T2 may include a gate electrode receiving the i-th scan signal Si, a source electrode connected to the k-th data line DLk, and a drain electrode connected to the third node N3.

The second transistor T2 performs a switching operation based on the i-th scan signal Si to provide the k-th data signal Dk to the source electrode of the first transistor T1 connected to the third node N3. The first transistor T1 may control the flow rate of a driving current I1 supplied to the organic light emitting diode OLED based on the k-th data signal Dk.

The first transistor TI may control the driving current I1 provided to the organic light emitting diode OLED in response to a potential difference Vgs between the gate electrode and the source electrode (hereinafter referred to as a gate-source voltage Vgs). More specifically, when the gate-source voltage Vgs is greater than a threshold voltage Vth, the first transistor T1 is turned on, and, when the voltage level of the source electrode of the first transistor T1 becomes the threshold voltage of the organic light emitting diode OLED, then the current between the source electrode and drain electrode of the first transistor T1, that is, the driving current I1, is provided to the organic light emitting diode OLED. Further the second transistor T2 may be a switch transistor.

The third transistor (e.g., a compensation transistor) T3 may include a gate electrode for receiving the i-th scan signal Si, a source electrode connected to the drain electrode of the first transistor T1, and a drain electrode connected to the gate electrode of the first transistor T1. The third transistor T3 may perform a switching operation based on the i-th scan signal Si, so as to connect the source electrode and gate electrode of the first transistor T1 to each other. Accordingly, the third transistor T3 may compensate the threshold voltage Vth of the first transistor T1 by diode-connecting the first transistor T1 through the switching operation. That is, the third transistor T3 may be a compensation transistor.

When the first transistor T1 is diode-connected, a voltage that is lowered from the voltage corresponding to the k-th data signal Dk, which is provided to the source electrode of the first transistor T1, by the threshold voltage Vth of the first transistor T1 may be provided to the gate electrode of the first transistor T1. The voltage lowered from a voltage Vk, which corresponds to the k-th data signal Dk provided to the source electrode of the first transistor T1, by the threshold voltage Vth of the first transistor T1 is referred to as a voltage (Vk-Vth) reflecting the threshold voltage Vth.

Because the gate electrode of the first transistor T1 is connected with one electrode of the storage capacitor Cst, the voltage Vk-Vth reflecting the threshold voltage Vth is maintained by the storage capacitor Cst. Because the voltage Vk-Vth reflecting the threshold voltage Vth of the first transistor T1 is applied to the gate electrode and is maintained, the driving current I1 flowing through the first transistor T1 is not influenced by the threshold voltage Vth of the first transistor T1. Thus, the threshold voltage deviation of the first transistor T1 can be compensated, and the luminance can be maintained evenly.

The fourth transistor T4 may include a gate electrode receiving the i-1-th scan signal Si-1, a source electrode receiving the initialization voltage VINT, and a drain electrode connected to the first node N1. The fourth transistor T4 may perform a switching operation based on the i-1-th scan signal Si-1 so as to provide the initialization voltage VINT to the first node N1. As described above, the first node N1 is connected with the gate electrode of the first transistor T1. Also, the i-1-the scan signal Si-1 is a signal provided earlier than the i-th scan signal Si.

Therefore, the fourth transistor T4 may be turned on first before the second transistor T2 is turned on, thereby providing the initialization voltage VINT to the gate electrode of the first transistor T1. The voltage level of the initialization voltage VINT is not particularly limited as long as the voltage level of the gate electrode of the first transistor T1 can be sufficiently lowered. That is, the fourth transistor T4 may be an initialization transistor.

The fifth transistor (e.g., a first control transistor) T5 may include a gate electrode receiving the ia-th light emission control signal EMia, a source electrode receiving the first driving voltage ELVDD1, and a drain electrode connected to a fifth node N5. The fifth transistor T5 performs a switching operation based on the ia-th light emission control signal EMia so as to provide the first driving voltage ELVDD1 to the source electrode of the first switching transistor T1 connected to the fifth node N5.

The sixth transistor (e.g., a third control transistor) T6 may include a gate electrode receiving the ib-th light emission control signal EMib, a source electrode connected to the second node N2, and a drain electrode connected to a fourth node N4. The sixth transistor T6 performs a switching operation based on the ib-th light emission control signal EMib so as to form a current path such that the driving current I1 flows in the direction of the organic light emitting diode OLED. The organic light emitting diode OLED may emit light according to a light emission current I2 corresponding to the driving current I1. That is, the fifth transistor T5 and the sixth transistor T6 may be light emission control transistors.

The seventh transistor T7 may include a gate electrode receiving the i-th scan signal Si, a source electrode receiving the initialization voltage VINT, and a drain electrode connected to the fourth node N4. In a state where the seventh transistor T7 is turned on, a bypass current I3 may flow from the fourth node N4 toward the seventh transistor T7 by a set voltage of the initialization voltage VINT.

Even when the minimum current of the first transistor T1 for displaying a black image flows as the driving current I1, the black image is not properly displayed if the organic light emitting diode OLED emits light. That is, the seventh transistor T7 may distribute a part of the minimum current of the first transistor T1 to a current path away from the organic light emitting diode OLED as the bypass current I3. Here, the minimum current of the first transistor T1 is referred to as a current under a condition that the gate-source voltage Vgs of the first transistor T1 is lower than the threshold voltage Vth of the first transistor T1, and thus the first transistor T1 is turned off. The black image is displayed when the minimum, or minimal, driving current is transferred to the organic light emitting diode OLED under a condition that the first transistor T1 is turned off. When the minimum driving current for displaying the black image flows, the influence of bypass transfer of the bypass current I3 is great. In contrast, when a driving current for displaying a general image or a white image flows, there is almost no influence of the bypass current I3.

Accordingly, when a driving current for displaying a black image flows, the light emission current I2 of the organic light emitting device OLED, which is reduced by the flow rate of the bypass current I3 (which is part of the driving current I1) through the seventh transistor T7, has a minimum current flow rate that is reduced to such a level that the black image can be reliably expressed. There, a contrast ratio can be improved by expressing an accurate or improved black image. That is, the seventh transistor T7 may be a bypass transistor.

The eighth transistor T8 may include a gate electrode receiving the i-th sensing signal SEi, a source electrode connected to the k-th data line DLk, and a drain electrode electrically connected to the first transistor T1. The eighth transistor T8 performs a switching operation based on the i-th sensing signal SEi so as to measure the hysteresis characteristic of the first transistor T1, and to provide the measured hysteresis characteristic to the sensing unit 132 (refer to FIG. 1) through the k-th data line DLk. That is, the eighth transistor T8 may be a sensing transistor.

The ninth transistor (e.g., a second control transistor) T9 may include a gate electrode receiving the i-th sensing signal SEi, a source electrode receiving the second driving voltage ELVDD2, and a drain electrode electrically connected to the fifth node N5. The ninth transistor T9 may perform a switching operation based on the i-th sensing signal SEi so as to provide the second driving voltage ELVDD2 to the fifth node N5. Here, the fifth node N5 is electrically connected with the source electrode of the first transistor T1. Thus, the ninth transistor T9 may provide the second driving voltage ELVDD2 to the source electrode of the first transistor T1. The ninth transistor T9 is turned on when the hysteresis characteristic of the first transistor T1 is measured to provide the second driving voltage ELVDD2 instead of the first driving voltage ELVDD1 to the source electrode of the first transistor T1, thereby improving the accuracy of hysteresis measurement.

Hereinafter, an operation of the organic light emitting display device according to an embodiment of the present invention will be described.

First, the signal flow between the data driver 130 and the timing controller 140, having been described with reference to FIG. 1, will be described with reference to FIG. 3. For the convenience of explanation, the aforementioned k-th pixel PXk connected with the data driver 130 through the k-th data line DLk will be described as an example.

Figure 3:
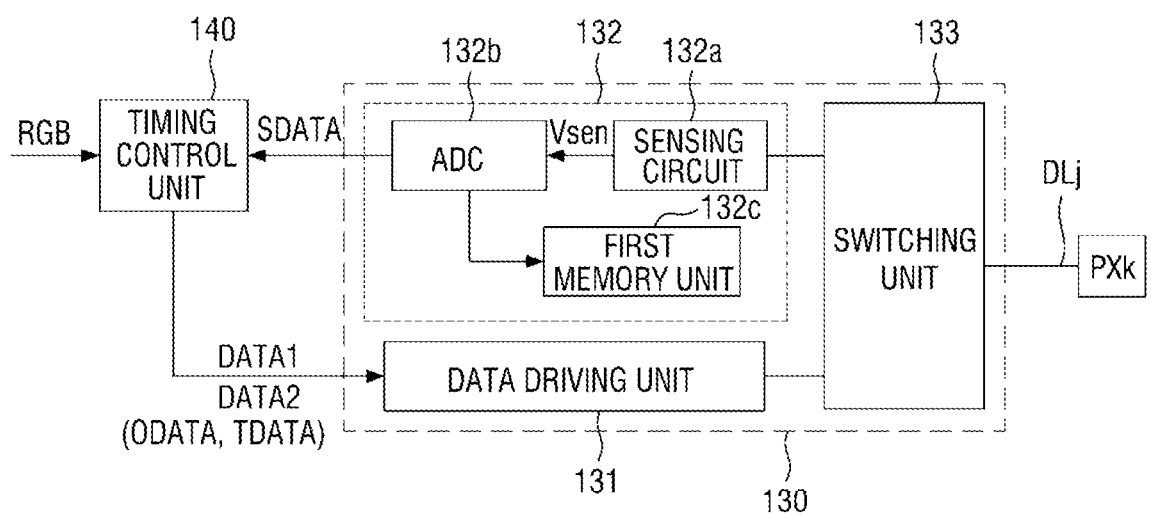
FIG. 3 is a diagram for explaining a signal flow among the timing controller, data driver and pixel shown in FIG. 1.

FIG. 3 is a diagram for explaining a signal flow among the timing controller, data driver and pixel shown in FIG. 1.

Referring to FIGS. 2 and 3, the data driver 130 may include a data driving unit 131, a sensing unit 132, and a switching unit (e.g., a switch bank) 133.

The data driving unit 131 may receive the first video data DATA1 or the second video data DATA2 from the timing controller 140. The first video data DATA1 is defined as gradation data provided to the pixels PX located in an area other than the hysteresis area of the display unit 110. That is, the first video data DATA1 is provided to a pixel of the plurality of pixels PX that does not receive the hysteresis measurement. The second video data DATA2 is defined as data provided to the pixel(s) located in the hysteresis area among the plurality of pixels PX. As described above, because the k-th pixel PXk is assumed to be included in the hysteresis area, the second video data DATA2 may be provided to the k-th pixel PXk.

Meanwhile, in an embodiment, the second video data DATA2 may include gradation data ODATA and measurement data TDATA. The gradation data ODATA is defined as data having a gradation value to be displayed by the k-th pixel PXk. The measurement data TDATA is defined as data suitable for measuring hysteresis.

The timing controller 140 may determine the hysteresis area using the video signal RGB and may provide the measurement data TDATA for measuring the hysteresis of the hysteresis area to the data driving unit 131. The data driving unit 131 may generate the k-th data signal Dk corresponding to the received measurement data TDATA, and may provide the k-th data signal Dk to the k-th pixel PXk located in the hysteresis area.

The timing controller 140 may provide the gradation data ODATA to the data driving unit 131 after providing the measurement data TDATA. The data driving unit 131 may generate the k-th data signal Dk corresponding to the gradation data ODATA, and may provide the generated k-th data signal Dk to the k-th pixel PXk. As described above, the gradation data ODATA has a gradation value that should be originally displayed by the k-th pixel PXk.

The k-th data signal Dk corresponding to the gradation data ODATA may be provided to the k-th pixel PXk after the hysteresis measurement of the k-th pixel PXk is performed. Accordingly, the k-th pixel PXk may perform light emission based on the k-th data signal Dk corresponding to the gradation data ODATA.

In an embodiment, the gradation data ODATA may be the same as the measurement data TDATA, or may be different from the measurement data TDATA. When the measured data TDATA and the gradation data ODATA are the same as each other, the k-th pixel PXk may measure the hysteresis of the k-th pixel PXk based on the gradation data ODATA to be originally displayed by the k-th pixel PXk.

The sensing unit 132 may include a sensing circuit 132a, an analog-digital converter (ADC) 132b, and a first memory 132c. The sensing circuit 132a may generate a sensing voltage Vsen using the driving current I1 flowing through the first transistor T1 of the k-th pixel PXk. The sensing voltage Vsen may be provided to the ADC 132b.

The ADC 132b may convert an analog sensing voltage Vsen into digital sensing data SDATA, and may then provide the digital sensing data SDATA to the first memory 132c and the timing controller 140. Here, in an embodiment, the ADC 132b may be provided for each channel, or one ADC 132b may be provided for a plurality of channels. Alternatively, all the channels may share one ADC 132b.

The first memory 132c may store the digital sensing data SDATA received from the ADC 132b. Unlike that shown in FIG. 3, the first memory 132c may receive the analog sensing voltage Vsen directly from the sensing circuit 132a. In an embodiment, the first memory 132c may be a lookup table (LUT). In other embodiments, the first memory 132c may be omitted.

The switch bank 133 may electrically connect the data driving unit 131 and the j-th data line DLj, or may electrically connect the sensing unit 132 and the j-th data line DLj, through a switching operation. For example, when providing the j-th data signal Dj to the k-th pixel PXk, the switch bank 133 may electrically connect the data driving unit 131 and the j-th data line DLj through a switching operation. In contrast, when hysteresis measurement of the hysteresis area is suitable, the switch bank 133 may electrically connect the sensing unit 132 and the j-th data line DLj through a switching operation.

Hereinafter, Details will be described as an example with reference to FIGS. 4 to 6.

Figure 4:
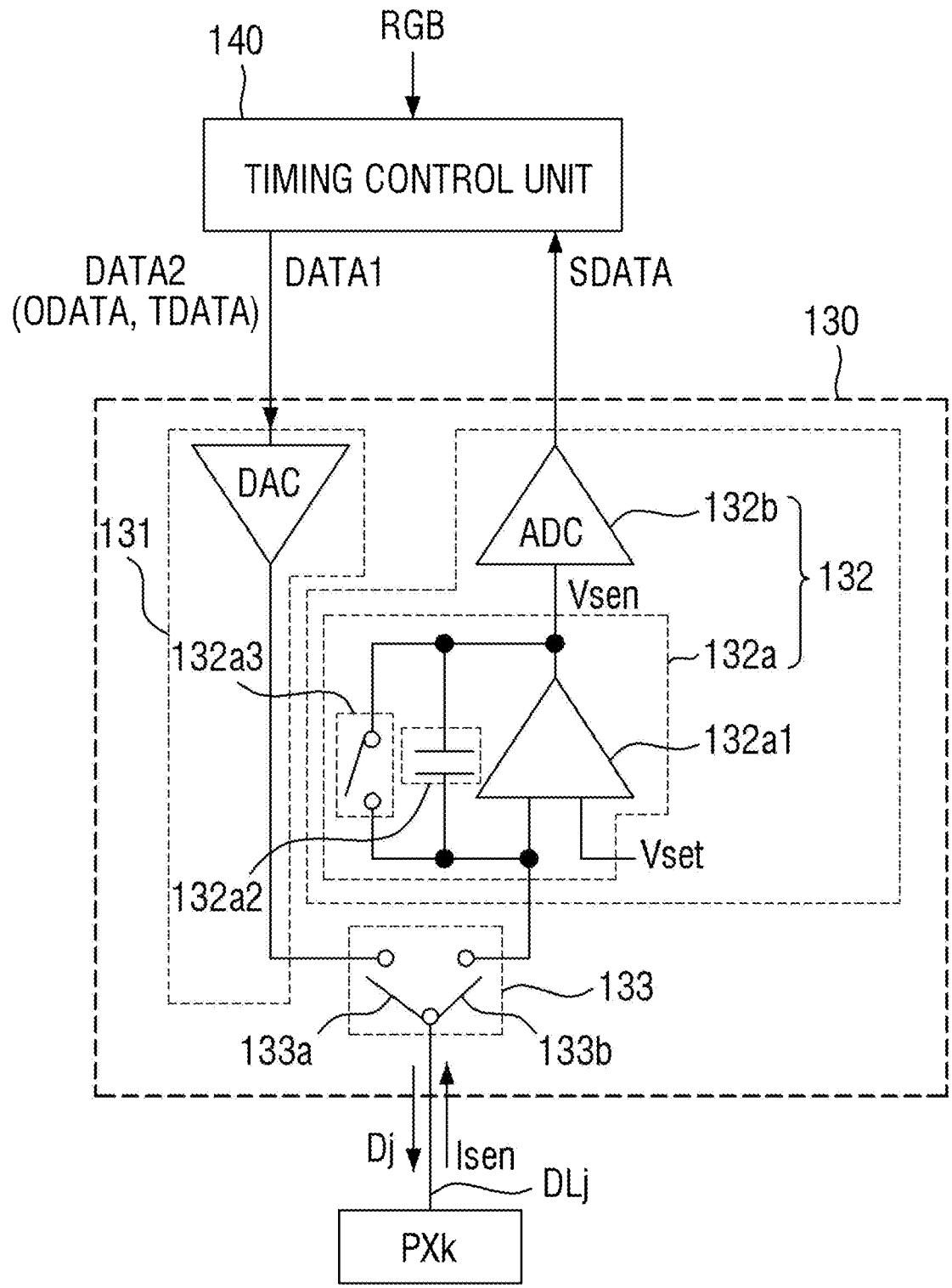
FIG. 4 is a diagram more specifically illustrating the data driver shown in FIG. 3.
Figure 5:
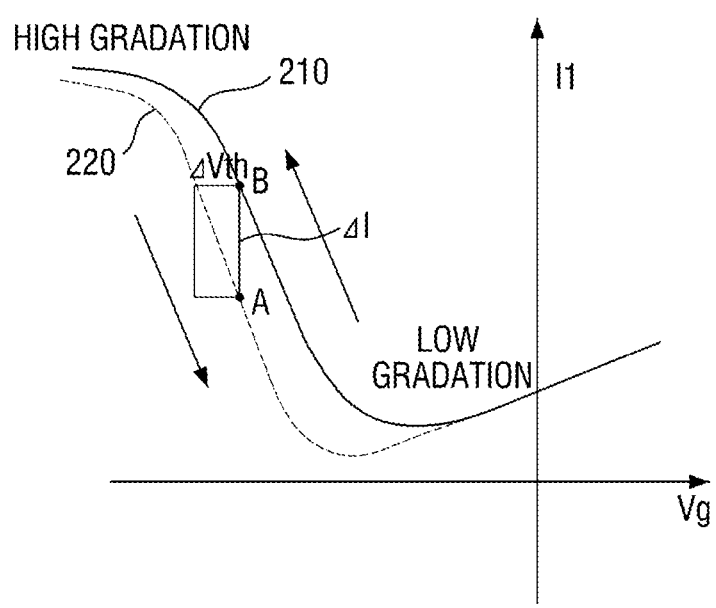
FIG. 5 is a graph illustrating the hysteresis characteristics of a first transistor of the k-th pixel shown in FIG. 2.
Figure 6A:
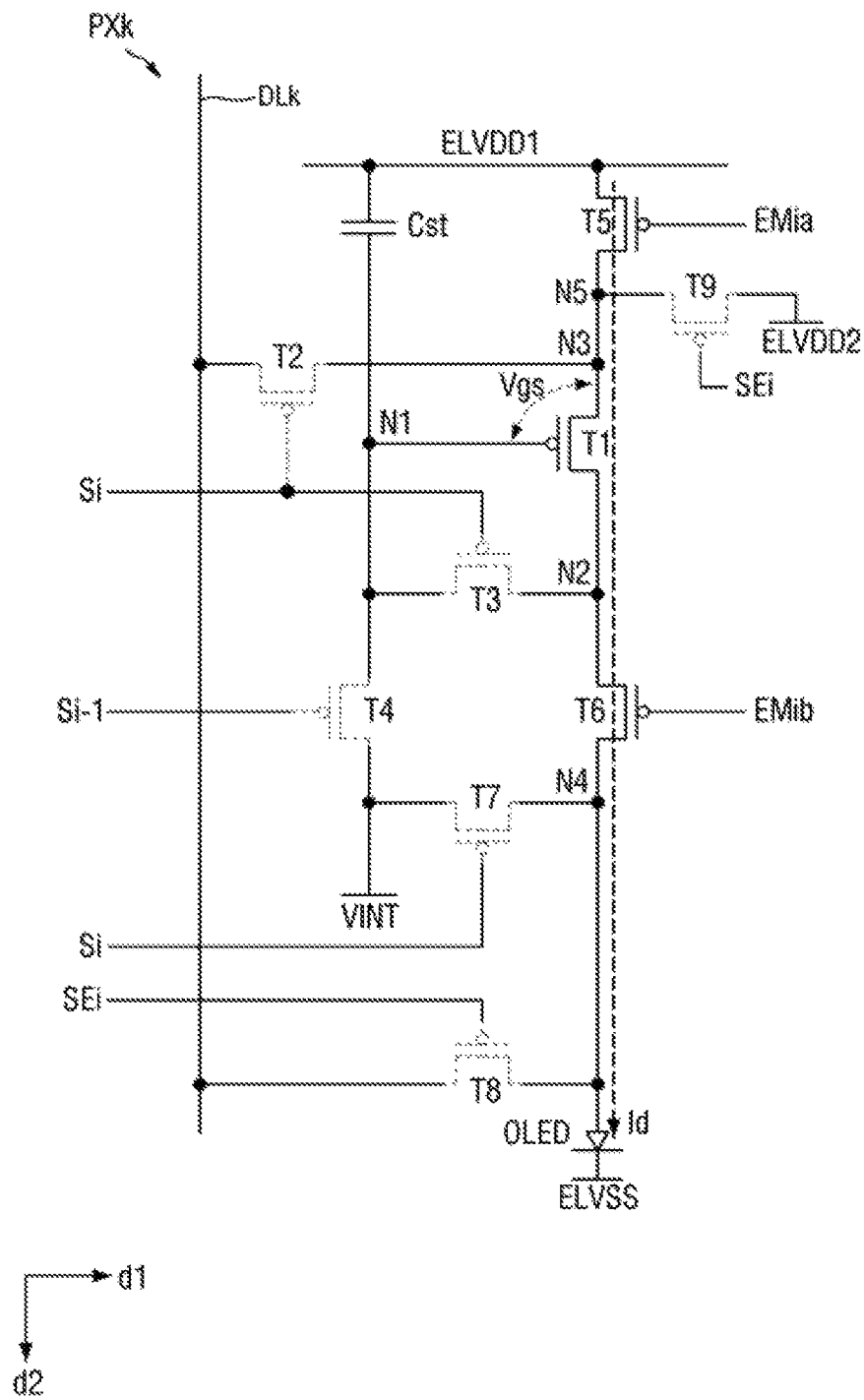
FIGS. 6A and 6B are diagrams for explaining the sensing driving and display driving of the k-th pixel shown in FIG. 2.
Figure 6B:
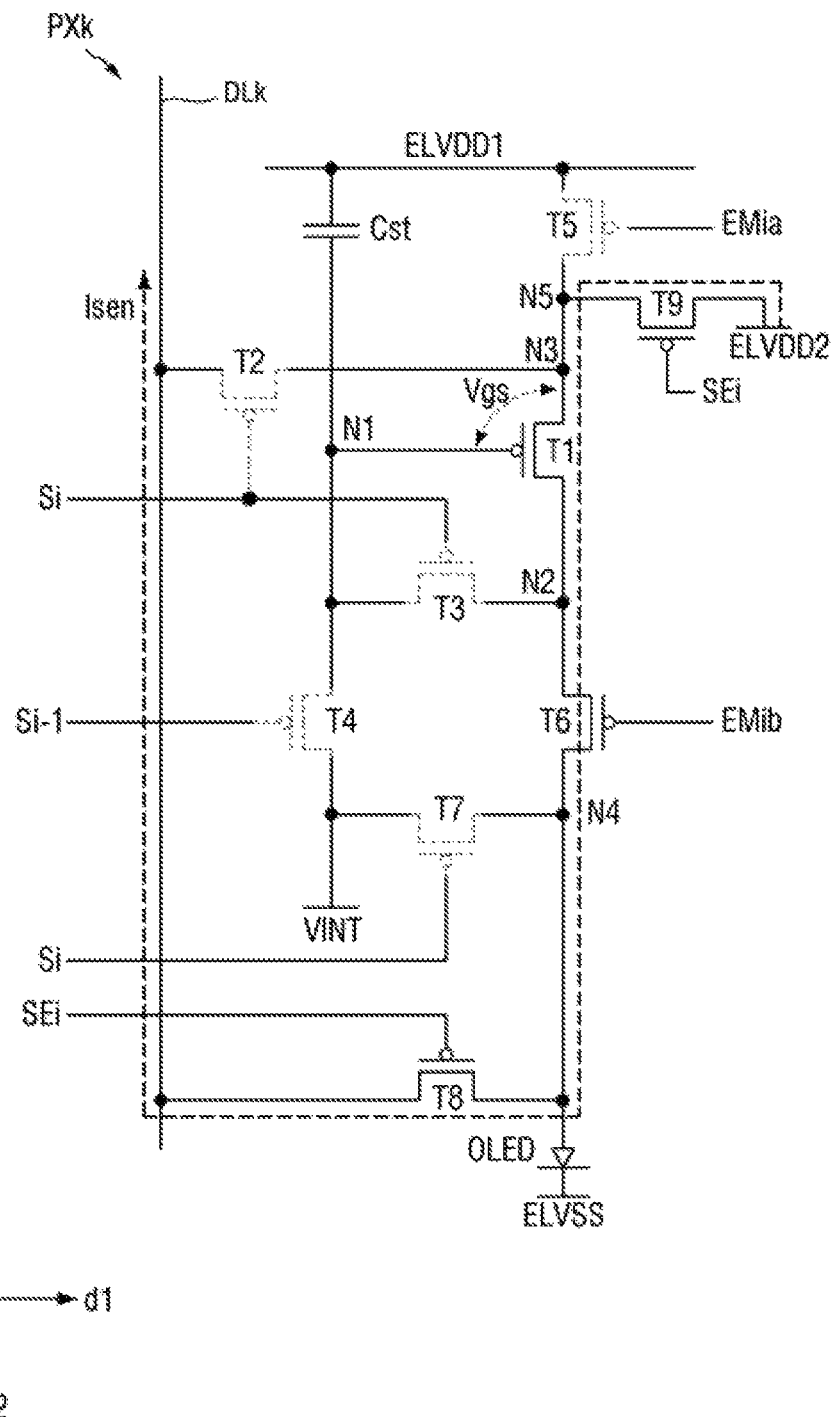

FIG. 4 is a diagram more specifically illustrating the data driver shown in FIG. 3. FIG. 5 is a graph illustrating hysteresis characteristics. FIGS. 6A and 6B are diagrams for explaining the sensing driving and display driving of the k-th pixel shown in FIG. 2.

First, hysteresis will be described with reference to FIGS. 2 and 5.

When the k-th data signal Dk is applied to the first transistor T1 of the k-th pixel PXk, the driving current I1 flowing through the first transistor T1 may be expressed by a first curve 210. Here, the driving current I1 may have a first current flow rate B. However, when the k-th data signal Dk having the same gradation value is continuously applied to the first transistor T1, hole trapping may occur in the first transistor T1. Due to the hole trapping, the driving current I1 may be expressed by a second curve 220. The driving current I1 may have a second current flow rate A.

That is, when the first transistor T1 continuously receives the k-th data signal Dk having the same gradation value, the first transistor T1 may have hysteresis characteristics in which the intensity of the driving current I1 decreases the threshold voltage Vth of the first transistor T1 in the negative direction.

Meanwhile, when the luminance of the k-th pixel PXk is changed from a high gradation (for example, a white gradation) to a middle gradation, the absolute value |Vg| of the gate voltage of the first transistor T1 of the k-th pixel PXk is changed from a relatively large value to a small value on the second curve 220. Here, because the gate voltage having a relatively large absolute value |Vg| at the high gradation is first applied to the first transistor T1, when the gate voltage Vg corresponding to the intermediate gradation is applied to the first transistor T1 in a state where the absolute value |Vth| of the threshold voltage of the first transistor T1 of the k-th pixel PXk increases, the current flow rate of the driving current I1 may be the same as that at the point A.

In contrast, when the luminance of the k-th pixel PXk is changed from a low gradation (for example, a black gradation) to a middle gradation, the absolute value |Vg| of the gate voltage of the first transistor T1 on the first curve 210 is changed from a relatively small value to a large value. Here, because the gate voltage having a relatively small absolute value |Vg| at the low gradation is first applied to the first transistor T1, when the gate voltage Vg corresponding to the intermediate gradation is applied to the first transistor T1 in a state where the absolute value Nth' of the threshold voltage of the first transistor T1 decreases by ΔVth, the current flow rate of the driving current I1 may be the same as that at the point B.

Accordingly, even if the same gate voltage Vg is applied to the first transistor T1 of the k-th pixel PXk to express the luminance of the intermediate gradation, or to measure the hysteresis of the first transistor T1, the flow rate of current flowing through the organic light emitting diode OLED becomes different depending on the previous expressed luminance (depending on the hysteresis of the first transistor T1). The difference in the current flow rate may be expressed by ΔI. The difference in the current flow rate may cause a residual image. The determination of the hysteresis area is performed based on the hysteresis definition.

An example will be described with reference to FIG. 4. The timing controller 140 may determine the hysteresis area based on the externally supplied video signal RGB. In an embodiment, the timing controller 140 may accumulate and store the video signals RGB, and may then determine the hysteresis area based on the accumulated video signals RGB. For this purpose, the timing controller 140 may further include a second memory, which may be a frame buffer.

More specifically, when the gradation value included in the video signal RGB provided to the display unit 110 is maintained at a low gradation (e.g., for a predetermined time or longer) and then changed to a high gradation, the timing controller 140 may determine the area where a high gradation value is provided as a hysteresis area. In addition, when the gradation value included in the video signal RGB provided to the display unit 110 is maintained at a high gradation (e.g., for a predetermined time or longer) and then changed to a low gradation, the timing controller 140 may determine the area where a low gradation value is provided as a hysteresis area.

The connection relationship between the sensing unit 132 and the k-th data line DLk will be mainly described with reference to FIGS. 4 and 6.

First, the data driver 130 will be described in more detail with reference to FIG. 4. However, contents overlapping those having described with reference to FIGS. 1 and 3 will not be repeated.

The data driving unit 131 may include a digital-analog converter DAC. The digital-analog converter DAC may be electrically connected to the timing controller 140 and the first switch 133*a*. The data driving unit 131 may receive the first video data DATA1 and second video data DATA2 of an analog form from the timing controller 140, and may generate the k-th data signal Dk obtained by converting the first video data DATA1 and the second video data DATA2 into the first video data DATA1 and second video data DATA2 of a digital form.

The sensing unit 132 may include a sensing circuit 132*a* and an ADC 132*b*. In FIG. 4, a description of the first memory 132*c* (refer to FIG. 3) will be omitted. The sensing circuit 132*a* may be connected with the ADC 132*b* and the second switch 133*b*.

The sensing circuit 132*a* may include an operation amplifier 132*a*1, a feedback capacitor 132*a*2, and a feedback switch 132*a*3.

In an embodiment, the operation amplifier 132*a*1 may include a first input terminal, a second input terminal, and an output terminal. In an embodiment, the first input terminal of the operational amplifier 132*a*1 may be provided with a reference voltage Vset. The second input terminal of the operation amplifier 132*a*1 may be connected with one end of the second switch 133*b*, one end of the feedback capacitor 132*a*2, and one end of the feedback switch 132*a*3. In an embodiment, the first input terminal of the operational amplifier 132*a*1 may be a non-inverting input terminal (+), and the second input terminal thereof may be an inverting input terminal (−).

One end of the feedback capacitor 132*a*2 may be connected with the second input terminal of the operation amplifier 132*a*1, and the other end thereof may be connected with the output terminal of the operation amplifier 132*a*1. One end of the feedback switch 132*a*3 may be connected with the second input terminal of the operation amplifier 132*a*1, and the other end thereof may be connected with the output terminal of the operation amplifier 132*a*1. The feedback capacitor 132*a*2 and the feedback switch 132*a*3 may be connected in parallel with each other.

The switch bank 133 may include the first switch 133*a* and the second switch 133*b*. In an embodiment, the first switch 133*a* and the second switch 133*b* may perform a switching operation based on the second control signal CONT2 (refer to FIG. 1) received from the timing controller 140. In other embodiments, the switch bank 133 may further include a switch for electrically connecting the initialization voltage terminal receiving the initialization voltage to the k-th data line DLk.

The above will be described in more detail with reference to FIGS. 4 and 6. FIG. 6A is an equivalent circuit diagram showing a case where the k-th pixel PXk displays an image. FIG. 6B is an equivalent circuit diagram showing a case of performing hysteresis measurement on the k-th pixel PXk.

Referring to FIGS. 4 and 6A, when the k-th data signal Dk is provided to the k-th pixel PXk, a signal path between the data driving unit 131 and the j-th data line DLj is conducted as the first switch 133*a* is turned on. More specifically, the timing controller 140 may provide the first video data DATA1 corresponding to the image to be displayed by the kth pixel PXk to the data driving unit 131. The data driving unit 131 may convert the received first video data DATA1 to generate the k-th data signal Dk. Accordingly, the k-th data signal Dk corresponding to the first video data DATA1 may be provided to the k-th pixel PXk connected to the k-th data line DLk. The first transistor T1 of the k-th pixel PXk may control the flow rate of a driving current Id provided to the organic light emitting diode OLED based on the k-th data signal Dk provided to the k-th pixel PXk.

In contrast, referring to FIGS. 4 and 6B, when it is suitable to measure the hysteresis of the k-th pixel PXk, a signal path between the sensing unit 132 and the k-th data line DLk is conducted as the second switch 133b is turned on. The feedback switch 132a3 may be turned on in advance to short the output terminal and second input terminal of the operational amplifier 132a1. Thus, the potential of the output terminal of the operation amplifier 132a1 may be maintained at the reference voltage Vset.

Thereafter, when the feedback switch 132a3 is turned off, the operation amplifier 132a1 may operate as an integrator. The second input terminal of the operation amplifier 132a1 may be electrically connected with the first transistor T1 through the eighth transistor T8 of the k-th pixel PXk. The feedback capacitor 132a2 may be charged with a voltage corresponding to the sensing current Isen flowing through the eighth transistor T8 of the k-th pixel PXk. Accordingly, the potential of the output terminal of the operation amplifier 132a1 may increase linearly in accordance with the voltage corresponding to the sensing current Isen at the reference voltage Vset. The operation amplifier 132a1 may provide the increased voltage to the ADC 132b as the sensing voltage Vsen. The ADC 132b may provide the sensing data SDATA converted from the sensing voltage Vsen to the timing controller 140.

The timing controller 140 may generate compensation data, in which hysteresis is compensated, based on the sensing data SDATA. The timing controller 140 may provide the compensation data to the data driving unit 131 such that the data signal based on the compensation data can be provided to the k-th pixel PXk included in the hysteresis area. If the hysteresis of the first transistor T1 can be compensated, the method of generating the compensation data is not particularly limited.

Hereinafter, a method of driving an organic light emitting display device according to an embodiment of the present invention will be described in detail with reference to FIGS. 7 to 17. As described above, the k-th pixel PXk is assumed to be a pixel suitable for hysteresis measurement. For comparison with the operation of the k-th pixel PXk, the operation of the first pixel PX1 will also be described. Hereinafter, the operation of the first pixel PX1 will be referred to as normal driving, and the operation of the k-th pixel PXk will be referred to as hysteresis measurement driving.

Figure 7:
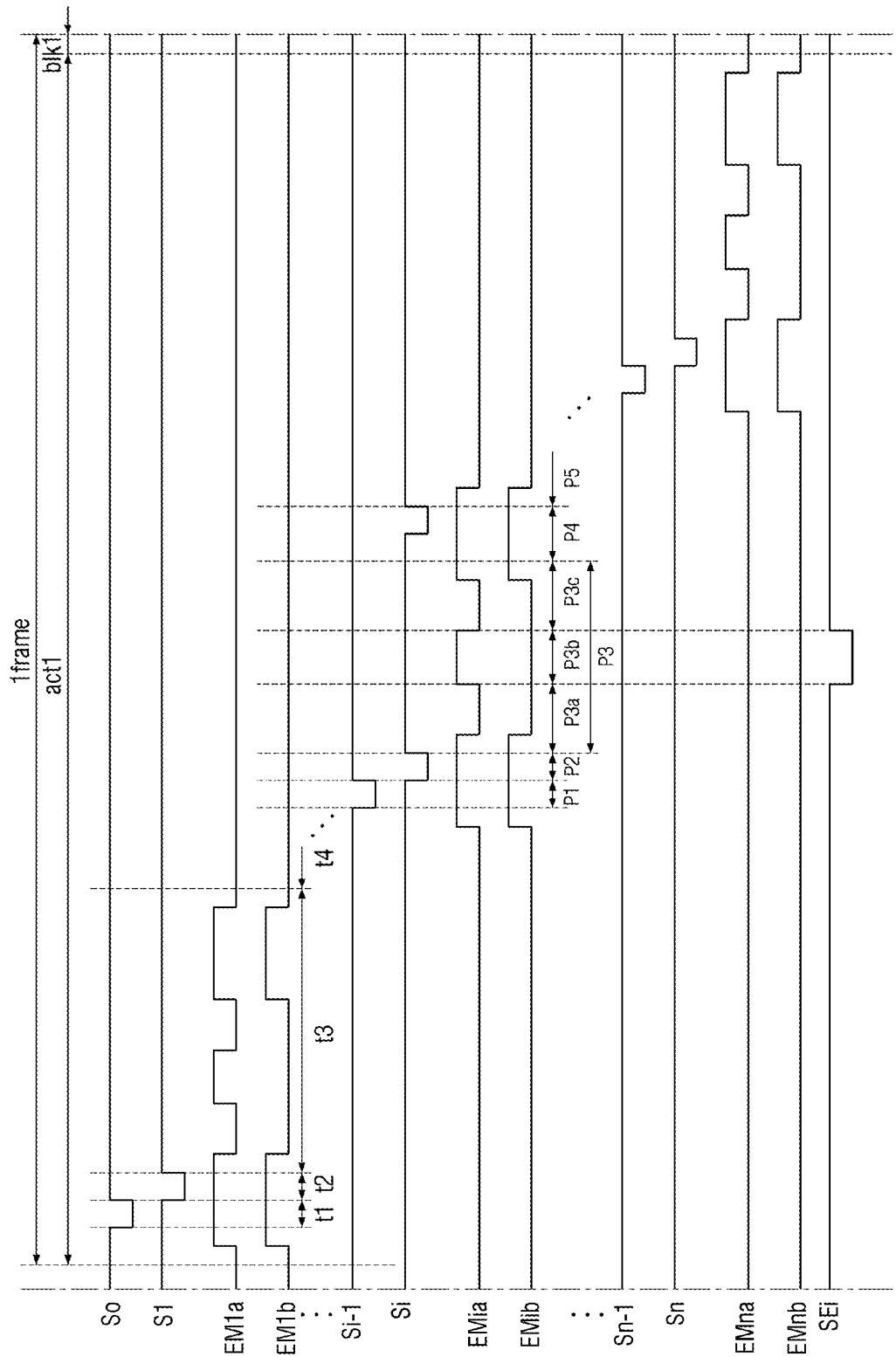
FIG. 7 is a timing diagram illustrating the driving operation of the organic light emitting display device according to an embodiment of the present invention.
Figure 8:
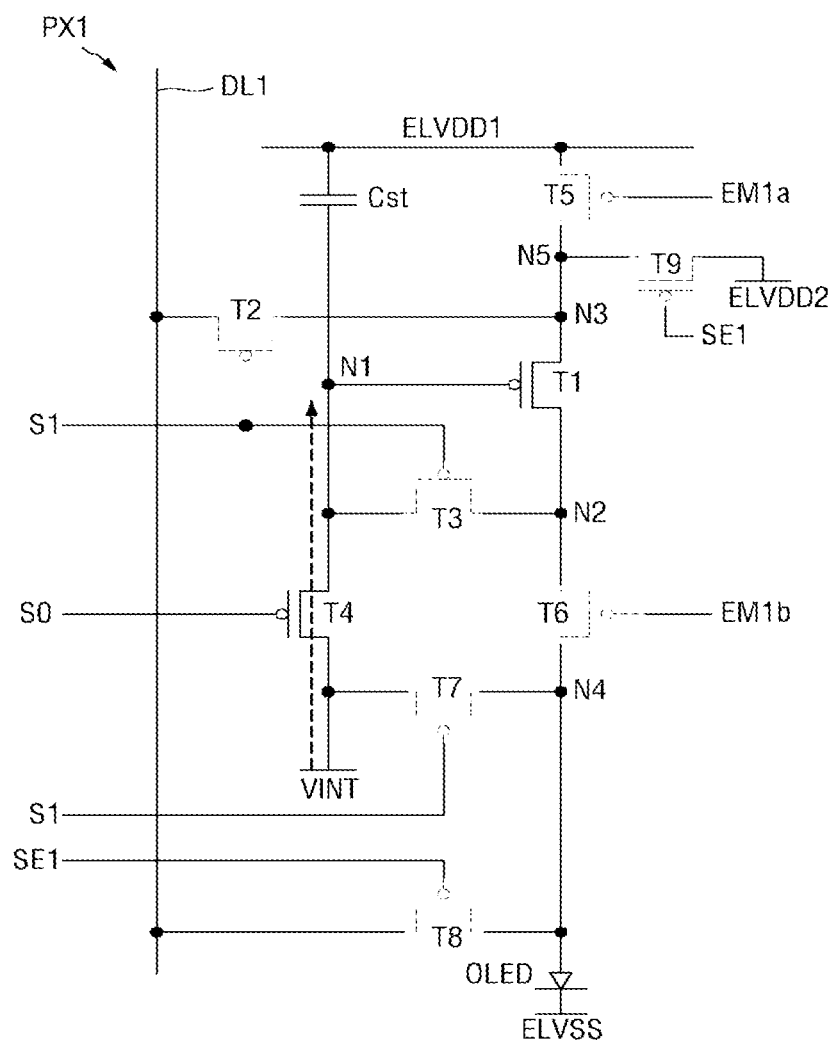
FIGS. 8 to 10 are diagrams for explaining the normal driving of the first pixel.
Figure 8:
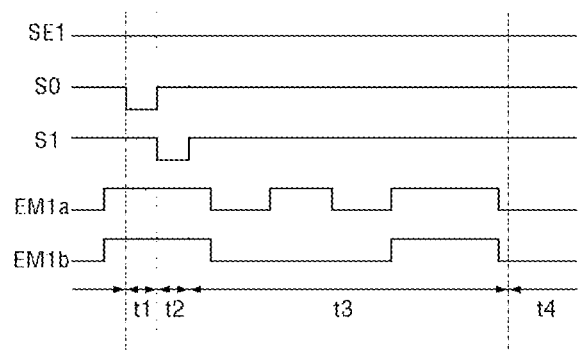
Figure 9:
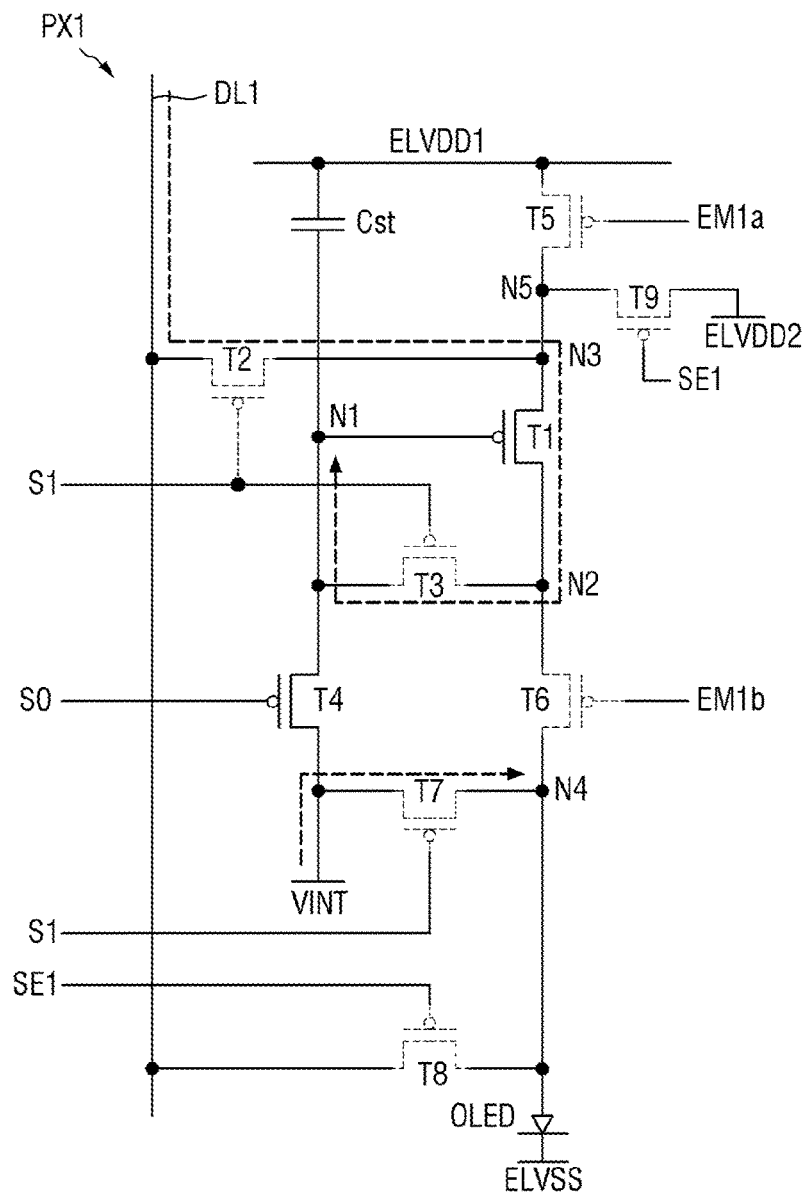
Figure 9:
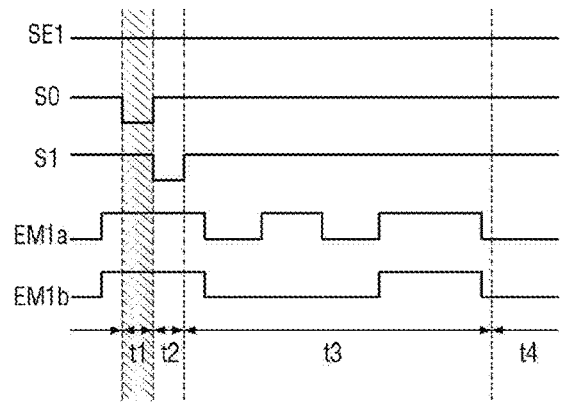
Figure 10:
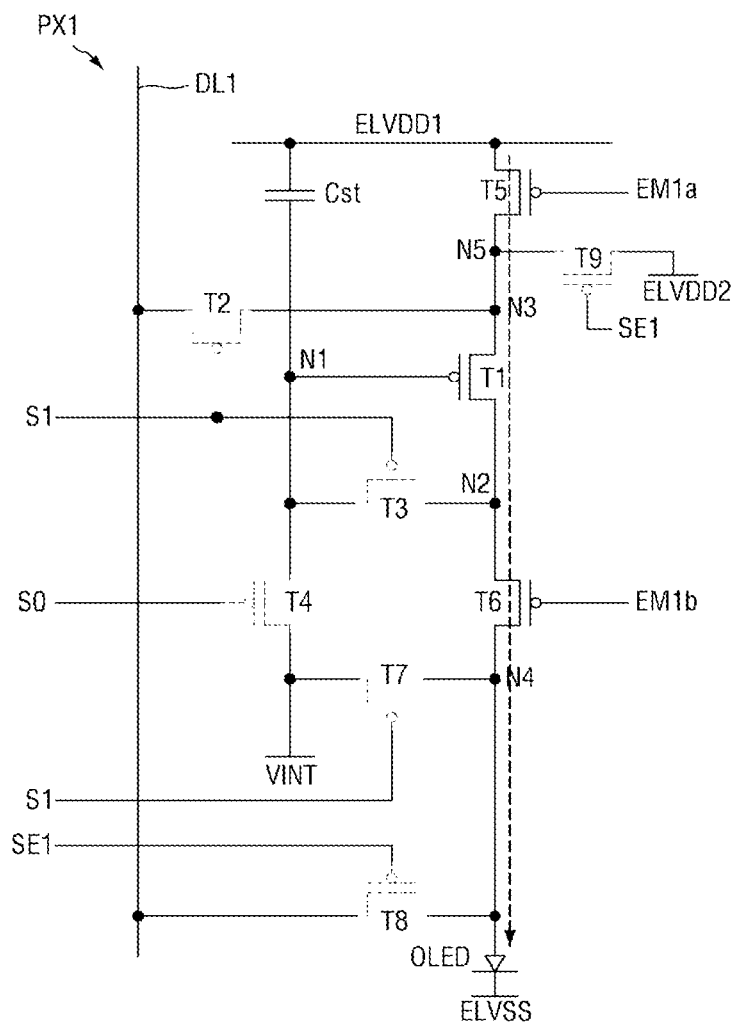
Figure 10:
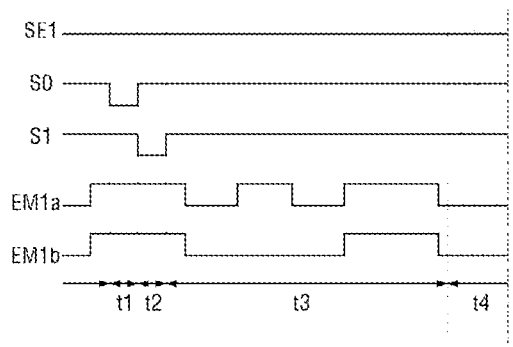

FIG. 7 is a timing diagram illustrating the driving operation of the organic light emitting display device according to an embodiment of the present invention. FIGS. 8 to 10 are diagrams for explaining the normal driving of the first pixel. FIGS. 11 to 17 are diagrams for explaining the hysteresis measurement driving of the k-th pixel.

Referring first to FIG. 7, a first frame (1frame) may be divided into a first active period (act1) and a first blank period (blk1).

The first active period (act1) is defined as a period in which first video data DATA1 or second video data DATA2 for displaying an image in the first frame (1frame) is inputted. The first blank period (blk1) is defined as a period during which first video data DATA1 or second video data DATA2 for displaying an image in the first frame (1frame) is not inputted.

The k-th pixel PXk may receive an i-th scan signal Si having two turn-on levels during the first frame (1frame). Here, the turn-on level refers to a level at which the transistor receiving the ith scan signal Si can be turned on, and may be a low level in an embodiment. An i-th sensing signal SEi having a turn-on level is provided between a period during which two i-th scan signals Si are provided. The period during which the i-th sensing signal SEi of the turn-on level is provided is defined as a sensing period. Meanwhile, even in the case of a pixel row receiving the same i-th scan signal Si as the k-th pixel PXk, an i-th scan signal Si having two turn-on levels during the first frame (1frame) may be provided. In contrast, in the case of a pixel not having hysteresis measurement, a scan signal having one turn-on level during the first frame (1frame) may be provided. For example, in the first pixel PX1, the first pixel PX1 may receive the first scan signal S1 having one turn-on level during the first frame 1frame.

Hereinafter, the operations of the k-th pixel PXk and the first pixel PX1 will be described in more detail. For the convenience of explanation, the operation of the first pixel PX1 will be first described.

Referring to FIG. 8, during the first driving period t1, a dummy scanning signal S0 is switched from a high level to a low level. The first sensing signal SE1, the first scan signal S1, the 1a-st light emission control signal EM1a, and the 1b-st light emission control signal EM1b maintain a high level.

When the dummy scan signal S0 is switched from a high level to a low level, the fourth transistor T4 of the first pixel PX1 is turned on. The fourth transistor T4 of the first pixel PX1 may provide an initialization voltage VINT to the first node N1. Here, the level of the initialization voltage VINT may be set low enough to initialize the first node N1. Because the gate electrode of the first transistor T1 of the first pixel PX1 is electrically connected to the first node N1, the gate electrode is set to the initialization voltage VINT.

Referring to FIG. 9, during the second driving period t2, the first scan signal S1 is switched from a high level to a low level. Further, the dummy scan signal S0 is switched from a low level to a high level. The first sensing signal SE1, the 1a-st light emission control signal EM1a, and the 1b-st light emission control signal EM1b maintain a high level.

Accordingly, in the first pixel PX1, the second transistor T2, the third transistor T3, and the seventh transistor T7 are turned on, and the fourth transistor T4 is turned off. When the third transistor T3 of the first pixel PX1 is turned on, the first transistor T1 is diode-connected. The first data signal D1 received from the first data line DL1 through the second transistor T2 of the first pixel PX1 is provided to the first node N1 through the third node N3 and the third transistor T3. Because the first transistor T1 of the first pixel PX1 is diode-connected, a difference voltage between the voltage corresponding to the first data signal D1 and the threshold voltage Vth of the first transistor T1 is transmitted to the first node N1. That is, a difference voltage, which is obtained by reducing a voltage level corresponding to the first data signal D1 by an absolute value of the threshold voltage Vth of the first transistor T1 of the first pixel PX1, is provided to the first node N1 of the first pixel PX1.

The storage capacitor Cst of the first pixel PX1 stores a charge corresponding to a voltage difference between the difference voltage provided to the first node N1 and the first driving voltage ELVDD. Meanwhile, when the seventh transistor T7 of the first pixel PX1 is turned on, the fourth node N4 is set to the initialization voltage VINT.

The third driving period t3 is defined as a period for hysteresis measurement. However, in the case of the first pixel PX1, the hysteresis measurement is not performed. In an embodiment, when the above light emission driver 150 described with reference to FIG. 1 is formed using a shift register or the like, the voltage level change of the ia-th light emission control signal EMia and ib-th light emission control signal EMib suitable for the hysteresis measurement of the k-th pixel PXk can be applied equally even to the first pixel PX1 in which the hysteresis measurement was not performed. Therefore, in the third driving period t3 of the first pixel PX1, the fifth transistor T5 and the sixth transistor T6 may be turned on or off depending on the voltage level applied thereto. Meanwhile, during the third driving period t3 of the first pixel PX1, the second transistor T2, the third transistor T3, the fourth transistor T4, the seventh transistor T7, the eighth transistor T8, and the ninth transistor T9 are maintained in a turned off state.

When the above light emission driver 150 described with reference to FIG. 1 is formed using an integrated circuit (IC), the voltage levels of the light emission control signals provided to the plurality of pixels PX can be independently controlled. In this case, the third driving period t3 of the first pixel PX1 may be omitted. The third driving period t3 will be described in more detail through a third measuring period P3 corresponding to the third driving period t3.

Next, the operation of the fourth driving period t4 will be described.

Referring to FIG. 10, during the fourth driving period t4, the 1a-st light emission control signal EM1a and the 1b-st light emission control signal EM1b are switched from a high level to a low level. The first sensing signal SE1, the dummy scan signal S0, and the first scan signal S1 maintain a high level.

Therefore, in the first pixel PX1, the fifth transistor T5 and the sixth transistor T6 are turned on, and the second transistor T2, the third transistor T3, the fourth transistor T4, the seventh transistor T7, the eighth transistor T8, and the ninth transistor T9 maintain a turned off state.

When the fifth transistor T5 and the sixth transistor T6 are turned on, a driving current flows from the first driving voltage ELVDD1 to the organic light emitting diode OLED through the fifth transistor T5, the first transistor T1, and the sixth transistor T6.

Next, the operation of the k-th pixel PXk included in the hysteresis area will be described in more detail with reference to FIGS. 11 to 17. However, a repeated description overlapping the contents having been described with reference to FIGS. 8 to 10 will be omitted.

Figure 11:
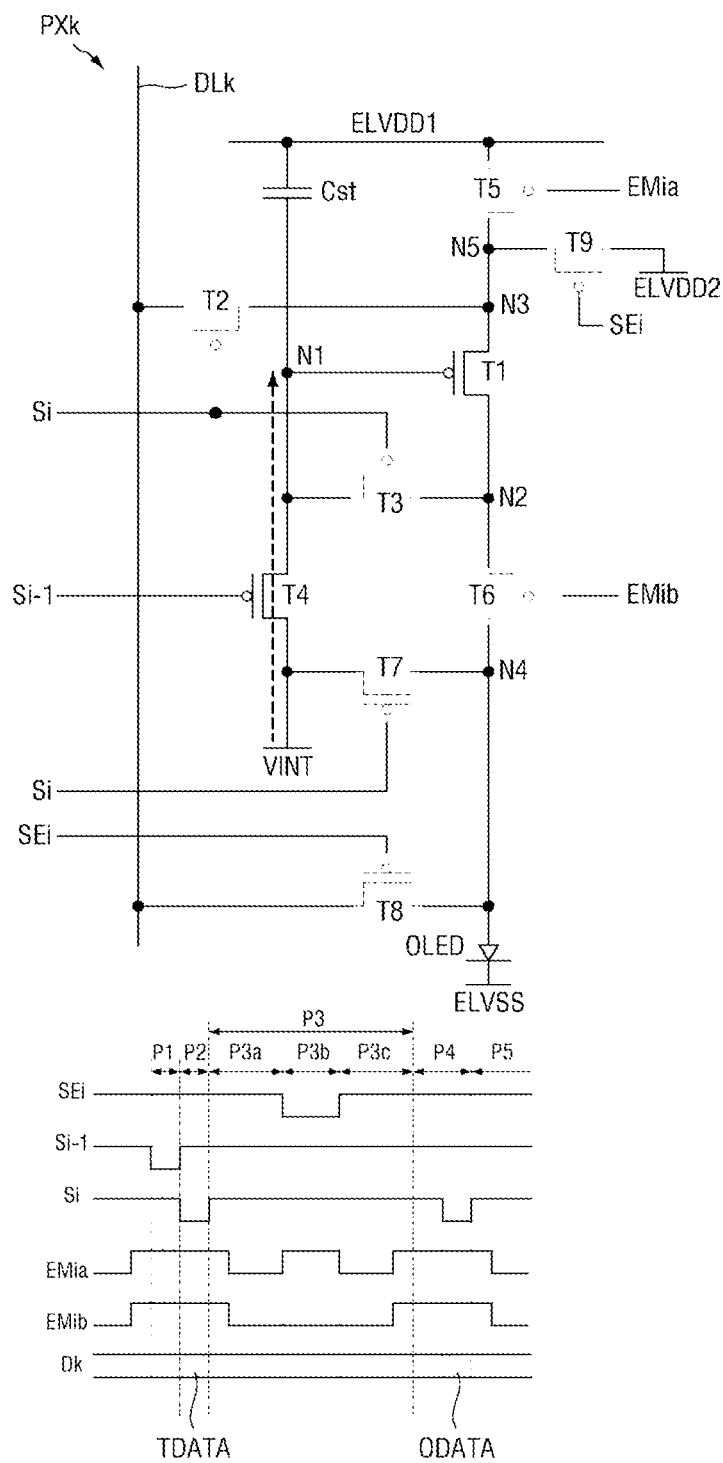
FIGS. 11 to 17 are diagrams for explaining the hysteresis measurement driving of the k-th pixel.

Referring to FIG. 11, during the first measurement period P1, the i-1-th scan signal Si-1 is switched from a high level to a low level. The i-th sensing signal SEi, the i-th scan signal Si, the ia-th light emission control signal EMia, and ib-th light emission control signal EMib maintain a high level.

When the i-1-th scan signal Si-1 is switched from a high level to a low level, the fourth transistor T4 of the k-th pixel PXk is turned on. The fourth transistor T4 of the k-th pixel PXk may provide the initialization voltage VINT to the first node N1, and the gate electrode of the first transistor T1 of the k-th pixel PXk is set to the initializing voltage VINT. That is, the first measurement period P1 is an initialization period.

Figure 12:
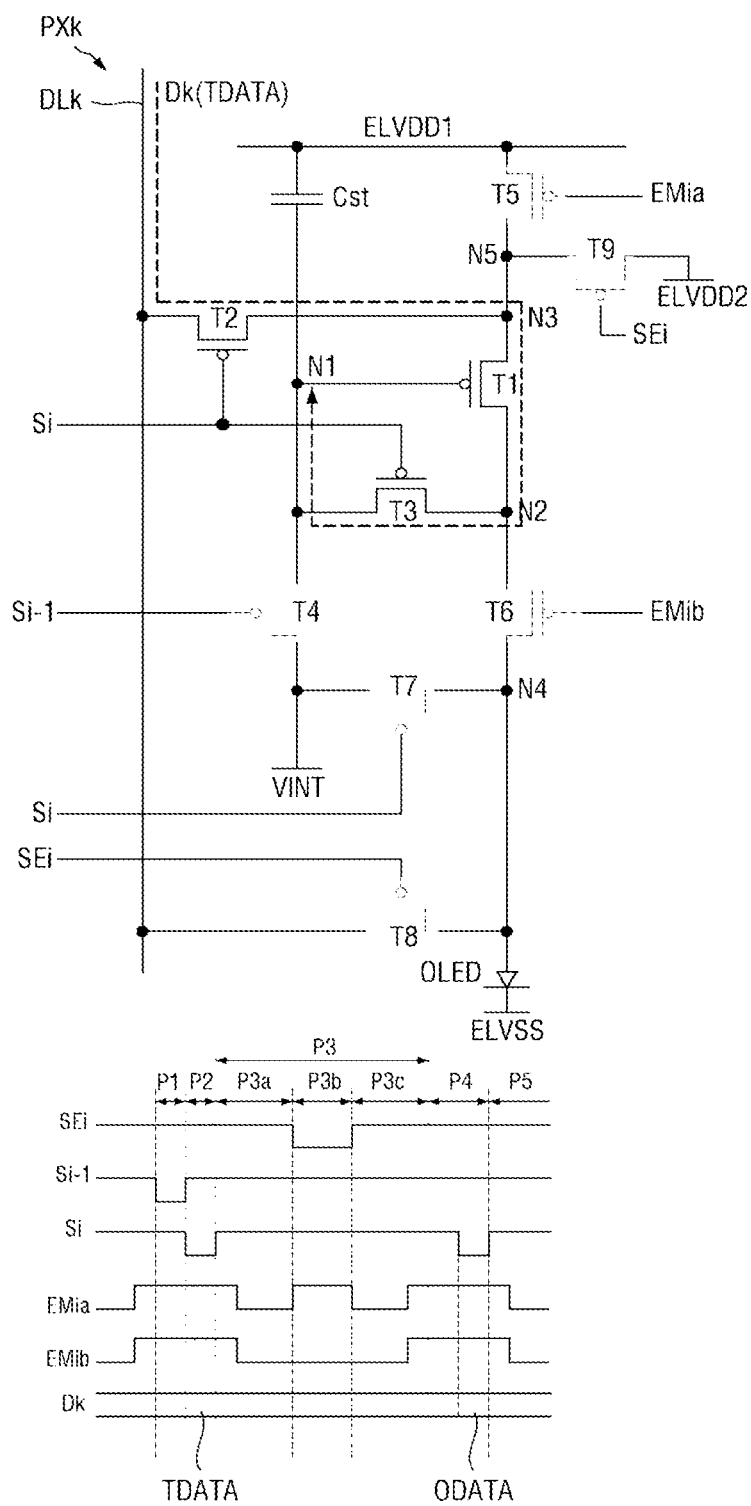

Referring to FIG. 12, during the second measurement period P2, the i-th scan signal Si is switched from a high level to a low level. Further, the i-1-th scan signal Si-1 is switched from a low level to a high level. The i-th sensing signal SEi, the ia-th light emission control signal EMia, and ib-th light emission control signal EMib maintain a high level.

Accordingly, in the k-th pixel PXk, the second transistor T2, the third transistor T3, and the seventh transistor T7 are turned on, and the fourth transistor T4 is turned off. When the third transistor T3 of the k-th pixel PXk is turned on, the first transistor T1 is diode-connected. The k-th data signal Dk received from the k-th data line DLk through the second transistor T2 of the k-th pixel PXk is provided to the first node N1 through the third node N3 and the third transistor T3. Here, the k-th data signal Dk is a data signal corresponding to the measurement data TDATA. That is, the source electrode of the first transistor TI may receive the k-th data signal Dk corresponding to the measurement data TDATA for hysteresis measurement through the k-th data line DLk.

Because the first transistor T1 of the first pixel PXk is diode-connected, a difference voltage between the voltage corresponding to the k-th data signal Dk and the threshold voltage Vth of the first transistor T1 is transmitted to the first node N1. That is, a difference voltage, which is obtained by reducing a voltage level corresponding to the k-th data signal Dk by an absolute value of the threshold voltage Vth of the first transistor T1 of the k-th pixel PXk, is provided to the first node N1 of the k-th pixel PXk. The storage capacitor Cst stores a charge corresponding to a voltage difference between the difference voltage provided to the first node N1 and the first driving voltage ELVDD1. That is, the second measurement period P2 is a measurement data TDATA input period for measuring the hysteresis of the first transistor T1 of the k-th pixel PXk.

As described above, the third measurement period P3 is a period for hysteresis measurement. The third measurement period P3 may be divided into a first sub-period P3a, a second sub-period P3b, and a third sub-period P3c.

Figure 13:
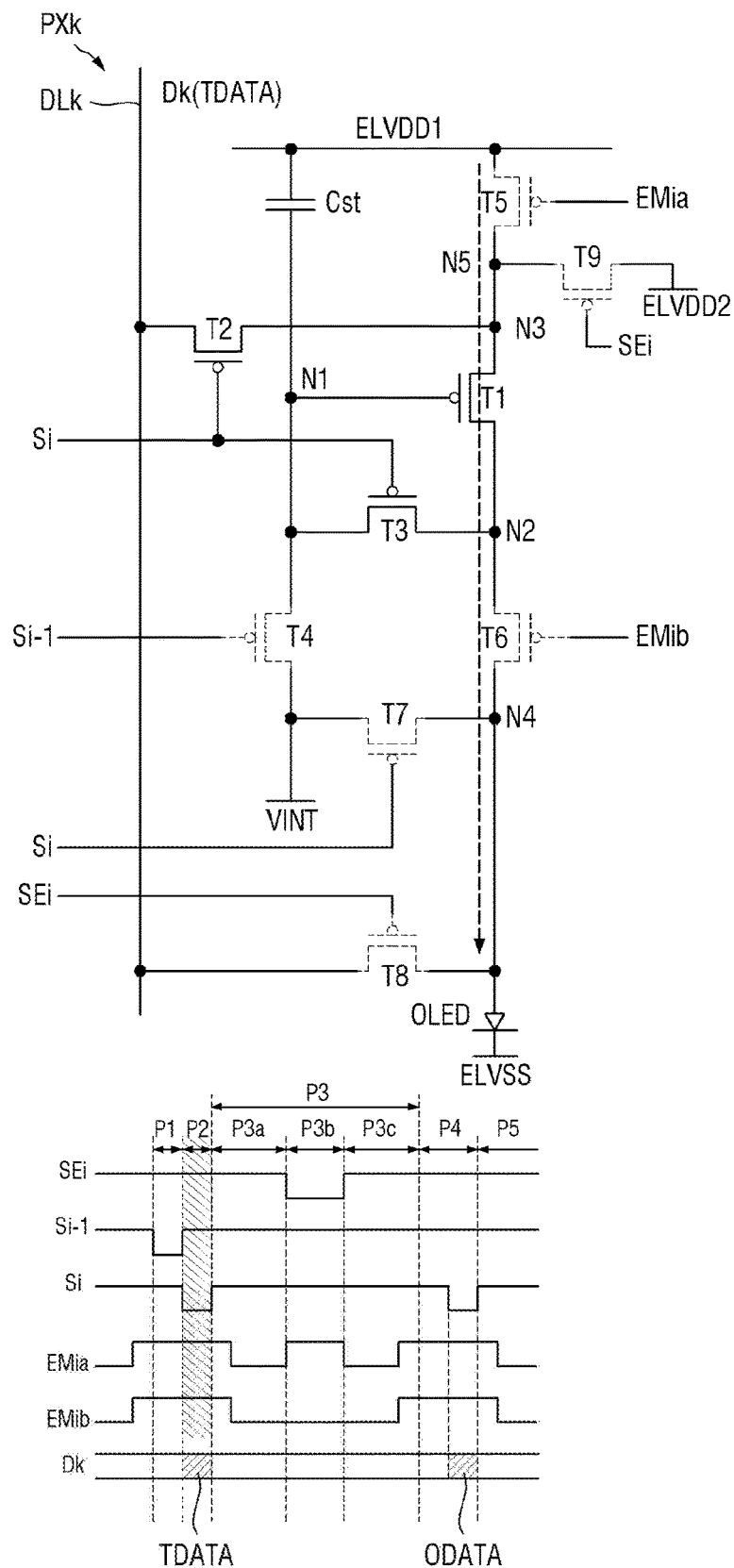

Referring to FIGS. 4 and 13, during the first sub-period P3a, the i-th scan signal Si is switched from a low level to a high level. Further, during the first sub-period P3a, the ia-th light emission control signal EMia and the ib-th light emission control signal EMib are switched from a high level to low level. Further, the i-th sensing signal SEi, the i−1-th scan signal Si−1, and the i-th scan signal Si maintain a high level.

Accordingly, in the k-th pixel PXk, the second transistor T2, the third transistor T3, and the seventh transistor T7 are turned off, and the eighth transistor T8 and the ninth transistor T9 are maintained in a turned off state. Meanwhile, the fifth transistor T5 and the sixth transistor T6 are turned on during the first sub-period P3a.

Figure 14:
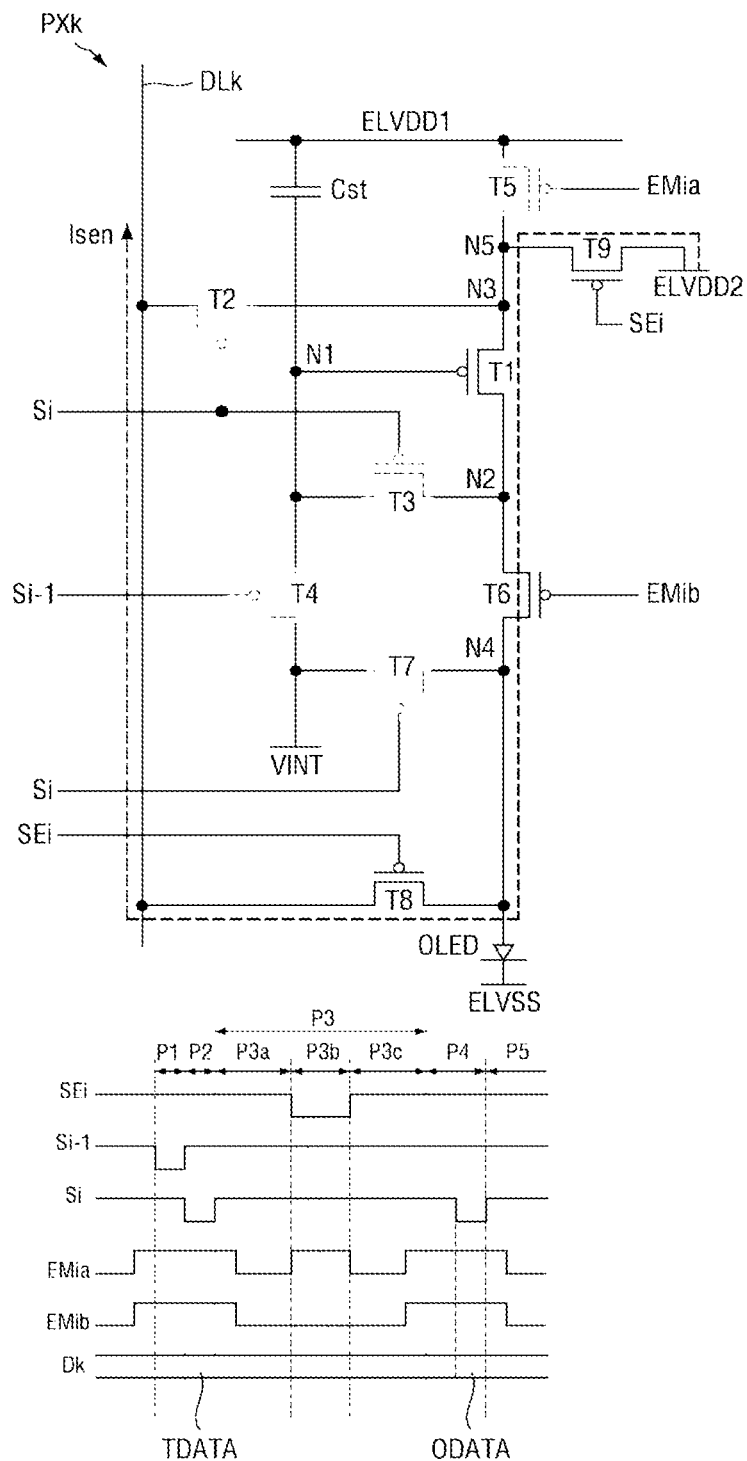

In the case of the second sub-section P3b, a description will be made with reference to FIGS. 4 and 14. During the second sub-period P3b, the i-th sensing signal SEi is switched from a high level to a low level. Further, the ia-th light emission control signal EMia is switched from a low level to a high level.

Accordingly, the eighth transistor T8 and the ninth transistor T9 are turned on, and the fifth transistor T5 is turned off. Further, the sixth transistor T6 maintains a turn on state.

When the sixth transistor T6, the eighth transistor T8, and the ninth transistor T8 are turned on, a current path is formed from the source electrode of the ninth transistor T9 receiving the second driving voltage ELVDD2 to the k-th data line DLk through the eighth transistor T8. Meanwhile, in the case of the second sub-period P3b, as the second switch 133b is turned on, a signal path between the sensing unit 132 and the k-th data line DLk is also conducted. Accordingly, the second input terminal of the operation amplifier 132a1 is electrically connected to the first transistor T1 through the eighth transistor T8 of the k-th pixel PXk. The sensing circuit 132a may provide a sensing voltage Vsen generated using the voltage corresponding to the sensing current Isen and the reference voltage Vset to the ADC 132b. The ADC 132b may provide the sensing data SDATA converted from the sensing voltage Vsen to the timing controller 140.

That is, as the eighth transistor T8 is turned on during the second sub-period P3b, the result of measuring the hysteresis of the first transistor T1 of the k-th pixel PXk may be provided to the timing controller 140 as the sensing data SDATA. Thus, the hysteresis measurement of the k-th pixel PXk determined as the hysteresis area can be performed in real time during the first active period act1. As the hysteresis measurement is performed in real time during the first active period act1, the measurement accuracy and signal to noise ratio (SNR) of the hysteresis of the first transistor T1 of the k-th pixel PXk can be improved.

Meanwhile, during the second sub-period P3b, as the fifth transistor T5 is turned off and the ninth transistor T9 is turned on, the hysteresis measurement may be performed using the second driving voltage ELVDD2.

This will be described in more detail. If the ninth transistor T9 is not present, the hysteresis measurement is performed through the first driving voltage ELVDD1 provided when the fifth transistor T5 is turned on. Here, the first driving voltage ELVDD1 is a voltage provided to all of the other pixels in addition to the k-th pixel PXk that receives a hysteresis measurement. Accordingly, a voltage drop due to an IR drop may occur in the first driving voltage ELVDD1. In particular, the voltage drop is likely to occur when the measurement data TDATA for the hysteresis measurement is provided in a hysteresis region where stress data causing hysteresis is provided. The gate source voltage Vgs or drain source voltage Vds of the first transistor T1 may be influenced by the voltage drop of the first driving voltage ELVDD1. This can cause problems with accuracy of the hysteresis measurement.

In contrast, the organic light emitting diode display device according to an embodiment of the present invention includes a ninth transistor T9. The ninth transistor T9 is turned on during the second sub-period P3b, and the fifth transistor T5 is turned off during the second sub-period P3b. Thus, the hysteresis measurement is performed through the second driving voltage ELVDD2 provided through the ninth transistor T9. In an embodiment, the second driving voltage ELVDD2 may have the same voltage level as the first driving voltage ELVDD1. In contrast, because the second driving voltage ELVDD2 is provided only to the pixel receiving the hysteresis measurement, that is, the k-th pixel PXk, or to the pixel row where the kth pixel PXk is located, the probability of a voltage drop occurring is relatively low. That is, during the second sub-period P3b, the hysteresis measurement is performed through the second driving voltage ELVDD2 with little or no voltage drop so that the accuracy of the hysteresis measurement can be improved. In particular, the sensing accuracy of a low current of about 20 to 30 nA can be improved.

Meanwhile, as described above, the measured hysteresis characteristics are provided to the timing controller 140 as sensing data SDATA. The timing controller 140 generates compensation data compensated for hysteresis based on the sensing data SDATA, and provides the generated compensation data to the data driving unit 131. The k-th pixel PXk can compensate for the hysteresis, and can improve instantaneous afterimage by compensating for the k-th data signal Dk corresponding to the compensation data. The timing at which the k-th data signal Dk corresponding to the compensation data is provided is not particularly limited. For example, the k-th data signal Dk may be provided in a second frame subsequent to the first frame (1frame).

Figure 15:
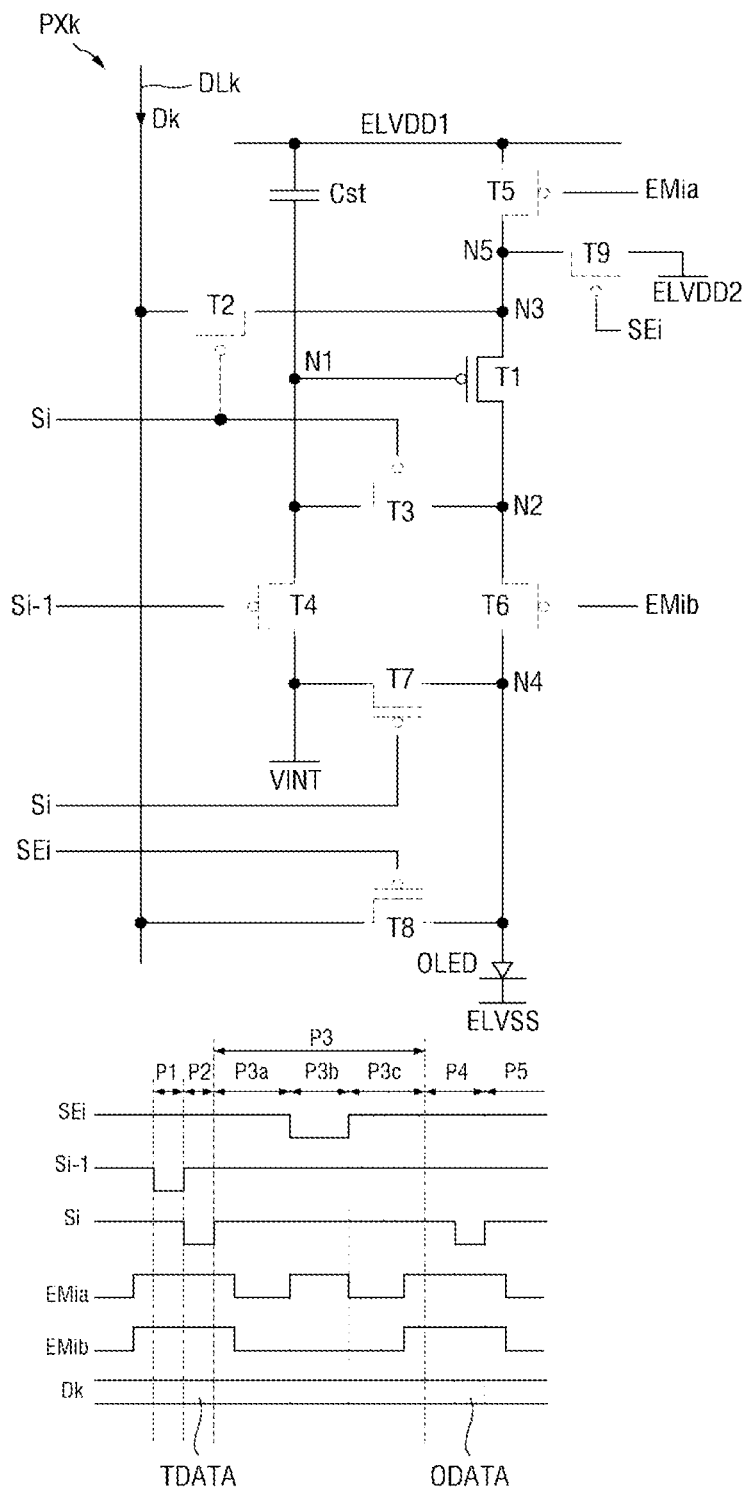

Referring to FIG. 15, during the third sub-period P3c, the ia-th light emission control signal EMia is switched from a high level to a low level, and then switched to the high level again. The ib-th light emission control signal EMib maintains a low level, and is then is switched to a high level. The high-level switching timing of the ia-th light emission control signal EMia may be the same as the high-level switching timing of the ib-th light emission control signal EMib. Meanwhile, the i-th sensing signal SEi is switched from a low level to a high level, and the i–1-th scan signal Si–1 and the i-th scan signal Si maintain a high level.

Thus, the eighth transistor T8 and the ninth transistor T9 of the k-th pixel PXk are turned off. Further, the fifth transistor T5 is turned on and then turned off again, and the sixth transistor T6 is maintained in a turn on state and then is turned off together with the fifth transistor T5.

Figure 16:
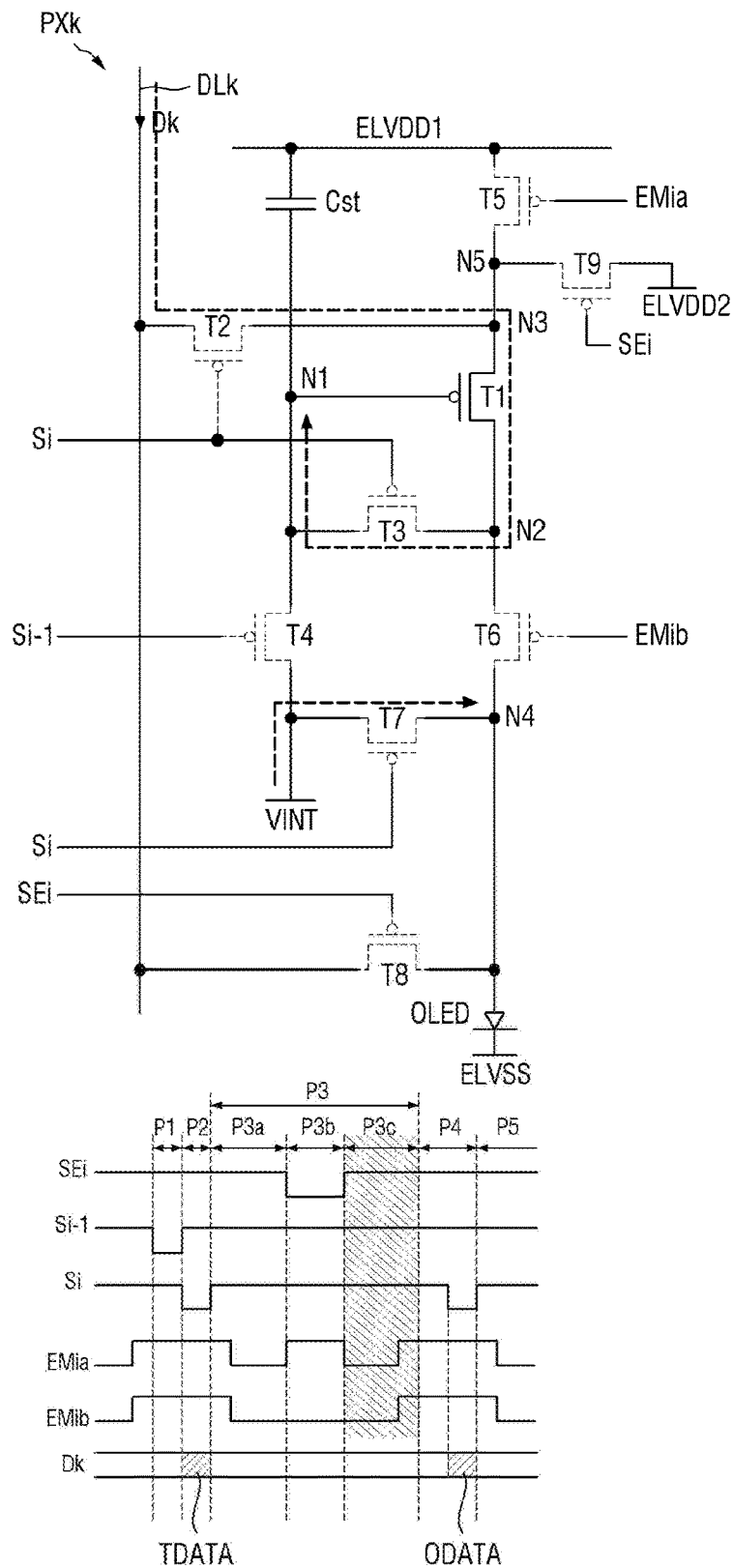

Referring to FIG. 16, during the fourth measurement period P4, the i-th scan signal Si is switched from a high level to a low level. Further, during the fourth measurement period P4, the i–1-th scan signal Si–1, the i-th sensing signal SEi, the ia-th light emission control signal EMia, and the ib-th light emission control signal EMib maintain a high level.

Accordingly, in the k-th pixel PXk, the second transistor T2, the third transistor T3, and the seventh transistor T7 are turned on, and the fourth transistor T4 is turned off. When the third transistor T3 of the k-th pixel PXk is turned on, the first transistor T1 is diode-connected. The k-th data signal Dk provided from the k-th data line DLk through the second transistor T2 of the k-th pixel PXk is provided to the first node N1 through the third node N3 and the third transistor T3. Here, the k-th data signal Dk is a data signal corresponding to the gradation data ODATA. That is, the source electrode of the first transistor T1 may receive the k-th data signal Dk having a gradation value to be emitted by the k-th pixel PXk during the first frame (1frame) through the k-th data line DLk. That is, the fourth measurement period P4 is an input period of the gradation data (ODATA) having a gradation value to be originally emitted from the k-th pixel PXk.

Figure 17:
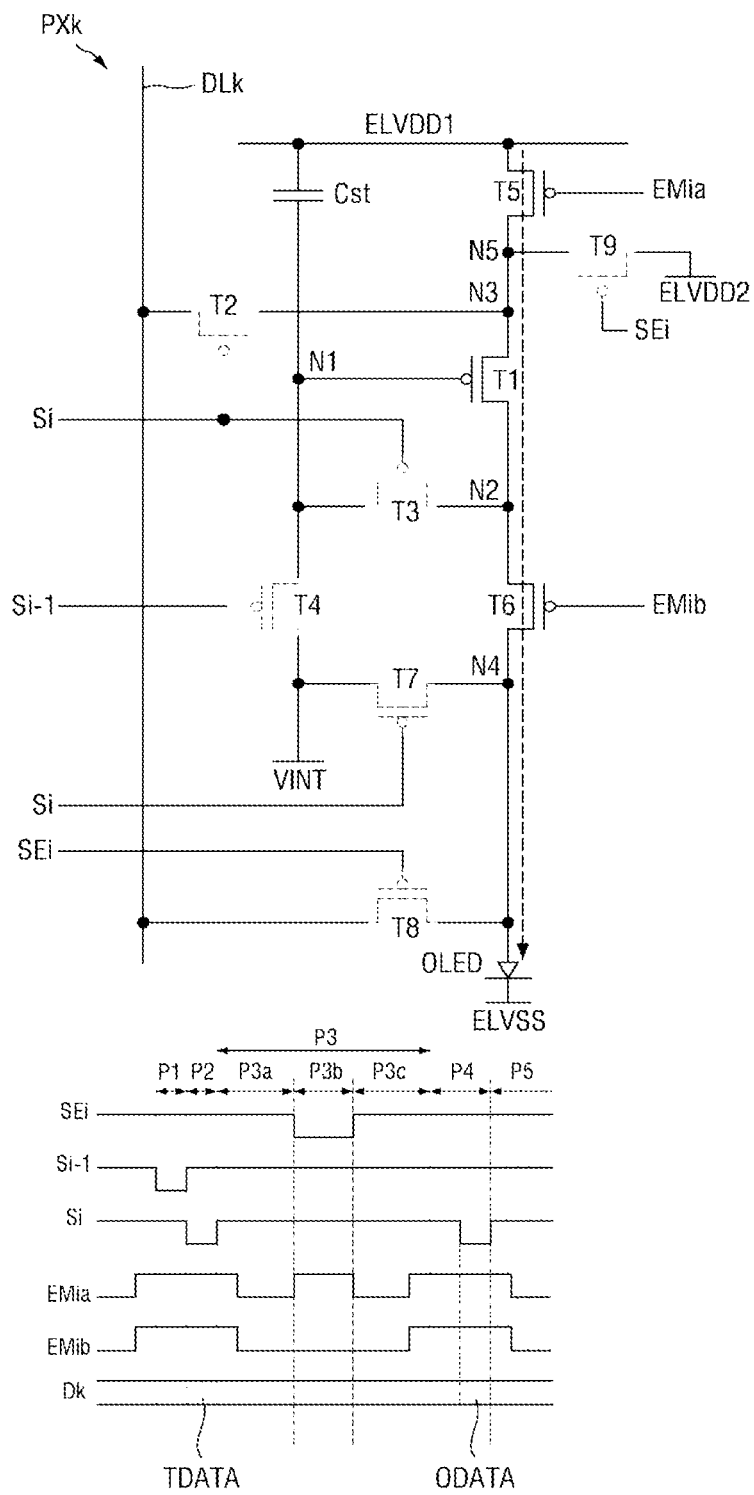

Referring to FIG. 17, during the fifth measurement period P5, the i-th scan signal Si is switched from a low level to a high level, and the i–1-th scan signal Si–1 and the i-th sensing signal SEi maintain at a high level. Further, during the fourth measurement period P4, the ia-th light emission control signal EMia and the ib-th light emission control signal EMib are switched from a high level to a low level.

Accordingly, the fifth transistor T5 and the sixth transistor T6 are turned on, and the second transistor T2, the third transistor T3, and the seventh transistor T7 are turned off. Further, the fourth transistor T4, the eighth transistor T8, and the ninth transistor T9 maintain a turned off state.

When the fifth transistor T5 and the sixth transistor T6 are turned on, a driving current flows from the first driving voltage ELVDD1 to the organic light emitting diode OLED through the fifth transistor T5, the first transistor T1, and the sixth transistor T6. Therefore, the k-th pixel PXk emits light with a gradation value corresponding to the gradation data ODATA in the fifth measurement period P5. That is, the fifth measurement period P5 is a light emission period.

The improvement in hysteresis measurement accuracy through the second driving voltage ELVDD2 will be described with reference to FIG. 18.

Figure 18:
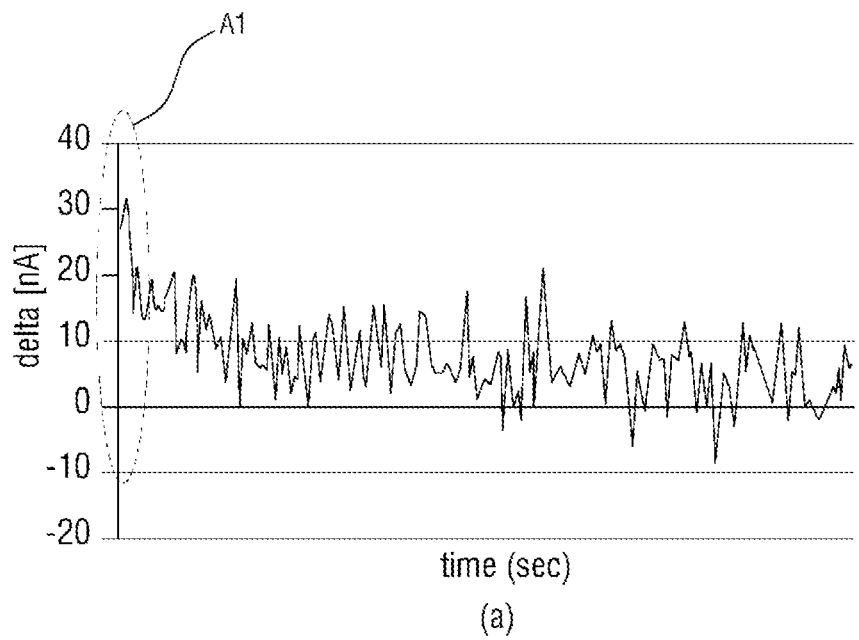
FIG. 18 is a graph illustrating the improvement in hysteresis measurement accuracy of the organic light emitting display device according to an embodiment of the present invention.
Figure 18:
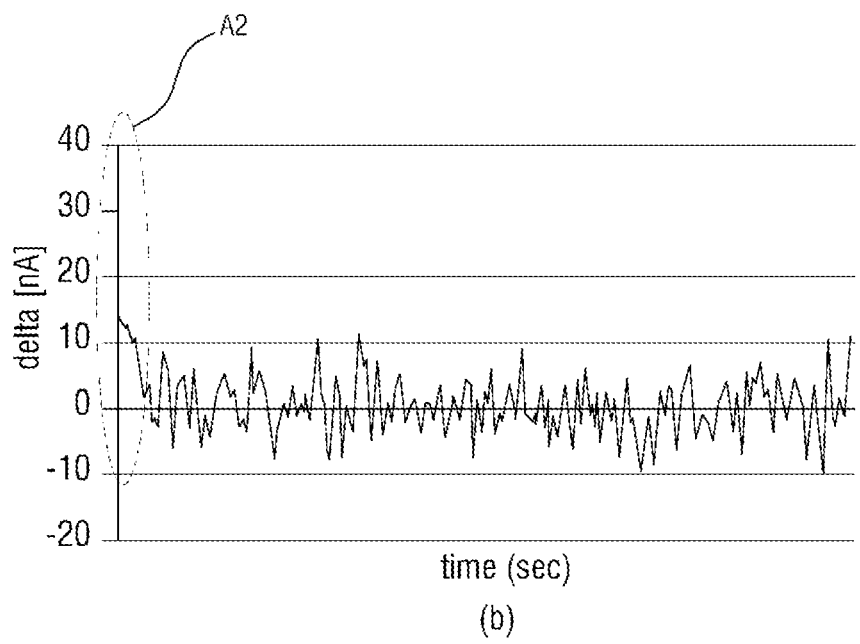

FIG. 18 is a graph illustrating the improvement in hysteresis measurement accuracy of the organic light emitting display device according to an embodiment of the present invention. Part (a) of FIG. 18 is a graph showing the hysteresis measurement data in the case of an organic light emitting display device according to an embodiment of the present invention. Part (b) of FIG. 18 is a graph showing the hysteresis measurement data in the case of an organic light emitting display device according to a comparative example. Here, the organic light emitting display device according to the comparative example illustrates a case of using the first driving voltage ELVDD1 provided through the source electrode of the fifth transistor T5 (refer to FIG. 2) for hysteresis measurement. For the sake of comparison accuracy, it is assumed that all of the cases of FIG. 18 include the same configuration, and receive the same measurement data TDATA, except for the difference of a driving voltage.

Referring to part (a) of FIG. 18, the hysteresis measurement value is relatively high as compared with the case of part (b) of FIG. 18. That is, even though the same measurement data (TDATA) is provided, it can be seen that the measured hysteresis value is high. This means that the accuracy of hysteresis measurement is high in the case of part (b) of FIG. 18, and demonstrates an improvement in accuracy over that of part (a) of FIG. 18. Meanwhile, each of area A1 and area A2 in FIG. 18 is defined as an initial period in which data provided in the hysteresis area changes. It can be seen that the hysteresis value in the initial period in the case of part (a) of FIG. 18 is higher than that in the case of part (b) of FIG. 18. This means that the accuracy of the hysteresis measurement in the initial period can be further improved.

Next, an organic light emitting display device according to another embodiment of the present invention will be described with reference to FIGS. 19 to 21. However, contents overlapping those having been described with reference to FIGS. 1 to 18 will not be repeated.

Figure 19:
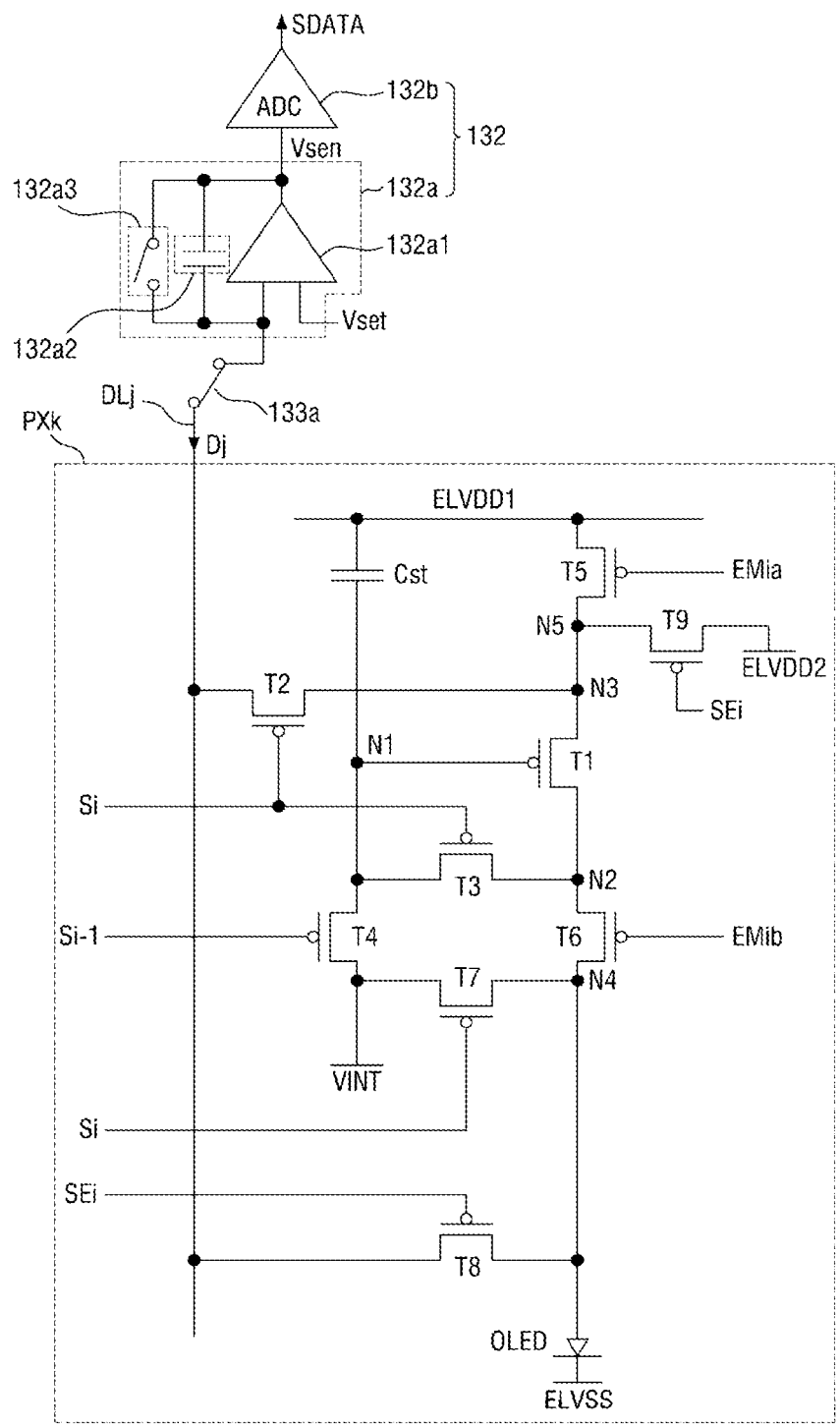
FIG. 19 is a diagram illustrating a state in which the k-th pixel and the sensing unit are connected to each other.

FIG. 19 is a diagram illustrating a state in which the k-th pixel and the sensing unit are connected to each other. FIG. 20 is a graph illustrating a change in luminance with respect to a gradation value. FIG. 21 is a diagram for explaining the contents for measuring hysteresis in a blank period.

Referring to FIGS. 3 and 19, the ADC 132b of the sensing unit 132 may modulate the hysteresis measured from the k-th pixel PXk into a digital value, and may provide the digital value to the timing controller 140. However, the digital value may be changed depending on the gradation value of the measurement data (TDATA) for hysteresis measurement.

Figure 20:
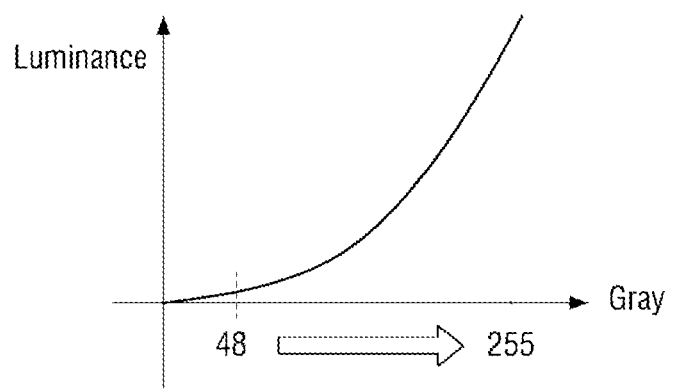
FIG. 20 is a graph illustrating a change in luminance with respect to a gradation value.

Referring to FIG. 20, it can be seen that the luminance also increases when the gradation value increases. More specifically, in the case of a low gradation in which the gradation value of the measurement data TDATA is relatively low, and in which low luminance is displayed, and in the case of a high gradation in which the gradation value of the measurement data TDATA is relatively high, and in which high luminance is displayed, the digital values are different even if the hysteresis of the first transistor T1 of the same k-th pixel PXk.

Here, in the case of the low gradation, the digital value due to the hysteresis measurement is small, and thus an accuracy problem may occur when generating the compensation data for compensating the hysteresis measurement.

However, the organic light emitting display device according to an embodiment of the present invention may acquire the digital value regardless of the gradation value of the measurement data TDATA by controlling the number of pixel rows in which the capacitance value of the feedback capacitor 132a2 and the hysteresis are measured.

For this purpose, the sensing unit 132 may constitute a lookup table based on the number of pixel rows in which the capacitance value of the feedback capacitor 132a2 and the hysteresis are measured, and may acquire the digital value according to the lookup table.

Table 1 below shows an example of the lookup table.

TABLE 1

| Sensing data (digital value) | Gradation value (G) | Data gain (dG) | Capacitor gain (cG) | Capacitor | The number of pixel rows |
|---|---|---|---|---|---|
| SDATA | 48 | 1 | 1 | dC | Max |
| | 49 | 1.046 | 0.955651 | dC*cG | Max |
| | omitted | | | | |
| | 99 | 4.916 | 0.203392 | | Max |
| | 100 | 5.026 | 0.397888 | | Max/2 |
| | 101 | 5.137 | 0.389272 | | Max/2 |
| | omitted | | | | |
| | 136 | 9.886 | 0.20229 | | Max/2 |
| | 137 | 10.047 | 0.398112 | | Max/4 |
| | 138 | 10.209 | 0.391793 | | Max/4 |
| | omitted | | | | |
| | 187 | 19.921 | 0.200789 | | Max/4 |
| | 188 | 20.156 | 0.396893 | | Max/8 |
| | 189 | 20.393 | 0.392288 | | Max/8 |
| | omitted | | | | |
| | 255 | 39.414 | 0.20297 | | Max/8 |

Here, dC is referred to as a capacitance value of the initially set feedback capacitor 132a2, and the capacitor gain cG is referred to as a gain value suitable to obtain the digital value of constant sensing data SDATA. The capacitor gain cG may be determined by Equation 1 below.

$$cG = 1/dG * \text{maximum value(Max) of the number of pixel rows/the number of pixel rows} \quad \text{Equation 1}$$

Here, the pixel row means a pixel row in which hysteresis measurement is performed, that is, a pixel row in which the sensing transistor T8 is turned on, and the maximum value (Max) of the number of pixel rows means the maximum number of hysteresis measurements that can be performed during one frame. The number of pixel rows and the maximum value (Max) of the number of pixel rows may be set in advance.

Hereinafter, a method of acquiring the digital value of the constant sensing data SDATA will be described as an example.

First, a case where the gradation value of the measurement data TDATA is 99 will be described as an example. The sensing unit 132 may convert the gradation value of the measurement data TDATA into a data gain (dG) value through Table 2 below.

TABLE 2

| Gradation value | Data Gain (dG) | Gradation value | Data Gain (dG) |
|---|---|---|---|
| 48 | 1 | 228 | 30.8124305 |
| 49 | 1.04640708 | 229 | 31.110526 |
| 50 | 1.09396469 | 230 | 31.4101878 |
| 51 | 1.14267751 | 231 | 31.711471 |
| 52 | 1.19255014 | 232 | 32.014252 |
| 53 | 1.24358709 | 233 | 32.3185836 |
| 54 | 1.29579281 | 234 | 32.6245237 |
| 55 | 1.34917166 | 235 | 32.9320367 |
| 56 | 1.40372797 | 236 | 33.241124 |
| 57 | 1.45946598 | 237 | 33.5517869 |
| 58 | 1.51638989 | 238 | 33.8640268 |
| 59 | 1.57450382 | 239 | 34.177845 |
| 60 | 1.63381186 | 240 | 34.4932428 |
| 61 | 1.69431802 | 241 | 34.8102215 |
| 62 | 1.75602628 | 242 | 35.1287825 |
| 63 | 1.81894054 | 243 | 35.4489271 |

TABLE 2-continued

| Gradation value | Data Gain (dG) | Gradation value | Data Gain (dG) |
|---|---|---|---|
| 64 | 1.88306467 | 244 | 35.7706565 |
| | Omitted | 245 | 36.0939721 |
| | | 246 | 36.4188752 |
| | | 247 | 36.7453671 |
| | | 248 | 37.073449 |
| | | 249 | 37.4031223 |
| | | 250 | 37.7343881 |
| | | 251 | 38.0672479 |
| | | 252 | 38.4017029 |
| | | 253 | 38.7377543 |
| | | 254 | 39.0754034 |
| | | 255 | 39.4146514 |

Meanwhile, as described above, the number of pixel rows may be set in advance. Accordingly, because the tone value of the measurement data TDATA is 99, the number of pixel rows is set to MAX. Thus, the eighth transistor T8 of the pixel PX located in all the pixel rows is turned on.

Figure 21:
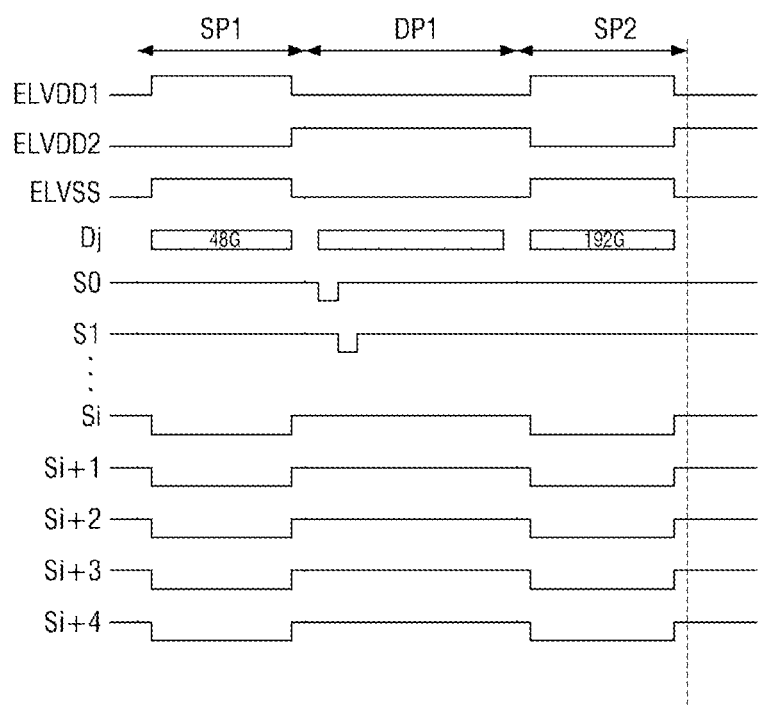
FIG. 21 is a diagram for explaining the contents for measuring hysteresis in a blank period.

Referring to FIG. 21, the eighth transistor T8 may be turned on in at least one of a first porch period SP1 and a second porch period SP2. An active period DP1 for inputting an image is located between the first and second porch periods SP1 and SP2. That is, the first and second porch periods SP1 and SP2 correspond to the blank period blk1 described above with reference to FIG. 7. Meanwhile, the first driving voltage ELVDD1 and the third driving voltage ELVSS may have the same voltage level in the first and second porch periods SP1 and SP2.

When the data gain dG and the number of pixel rows are determined, the capacitor gain cG is set according to Equation 1 above. The preliminary capacitance value of the feedback capacitor 132a2 is set by multiplying the capacitor gain cG by the default value of the pre-set feedback capacitor 132a2. Here, the preliminary capacitance value of the feedback capacitor 132a2 means a preliminary capacitance value of the feedback capacitor 132a2 before a voltage corresponding to the sensing current Isen having been described with reference to FIG. 6B is charged.

As described above with reference to FIG. 6B, the feedback capacitor 132a2 may be charged with a voltage corresponding to the sensing current Isen flowing through the eighth transistor T8 of the k-th pixel PXk. If the preliminary capacitance value of the feedback capacitor 132a2 is fixed, the sensing voltage Vsen corresponding to the sensing current Isen charged in the feedback capacitor 132a2 may be varied by the gradation value of the measurement data TDATA.

However, the organic light emitting display device according to an embodiment of the present invention may have a constant potential of the sensing voltage Vsen output from the output terminal of the operational amplifier 132a1 by using the lookup table (LUT) to vary the capacitance value of the feedback capacitor 132a2 depending on the gradation value of the measurement data TDATA. The ADC 132b may generate sensing data SDATA obtained by converting the sensing voltage Vsen into a digital value. Therefore, the sensing data SDATA output from the ADC 132b may have a constant digital value.

Meanwhile, the number of the pixel rows and the default value of the feedback capacitor 132a2 are limited to preset values in the lookup table (LUT) if the sensing data SDATA output from the ADC 132b can have a constant digital value.

That is, the organic light emitting display device according to an embodiment of the present invention allows the sensing data SDATA output from the ADC 132b to have a constant digital value by using the capacitance value of the feedback capacitor 132a2 and the number of pixel rows where a pixel in which the eighth transistor T8 is turned on is located, thereby improving the measurement accuracy of hysteresis even in the case of a low gradation.

Figure 22:
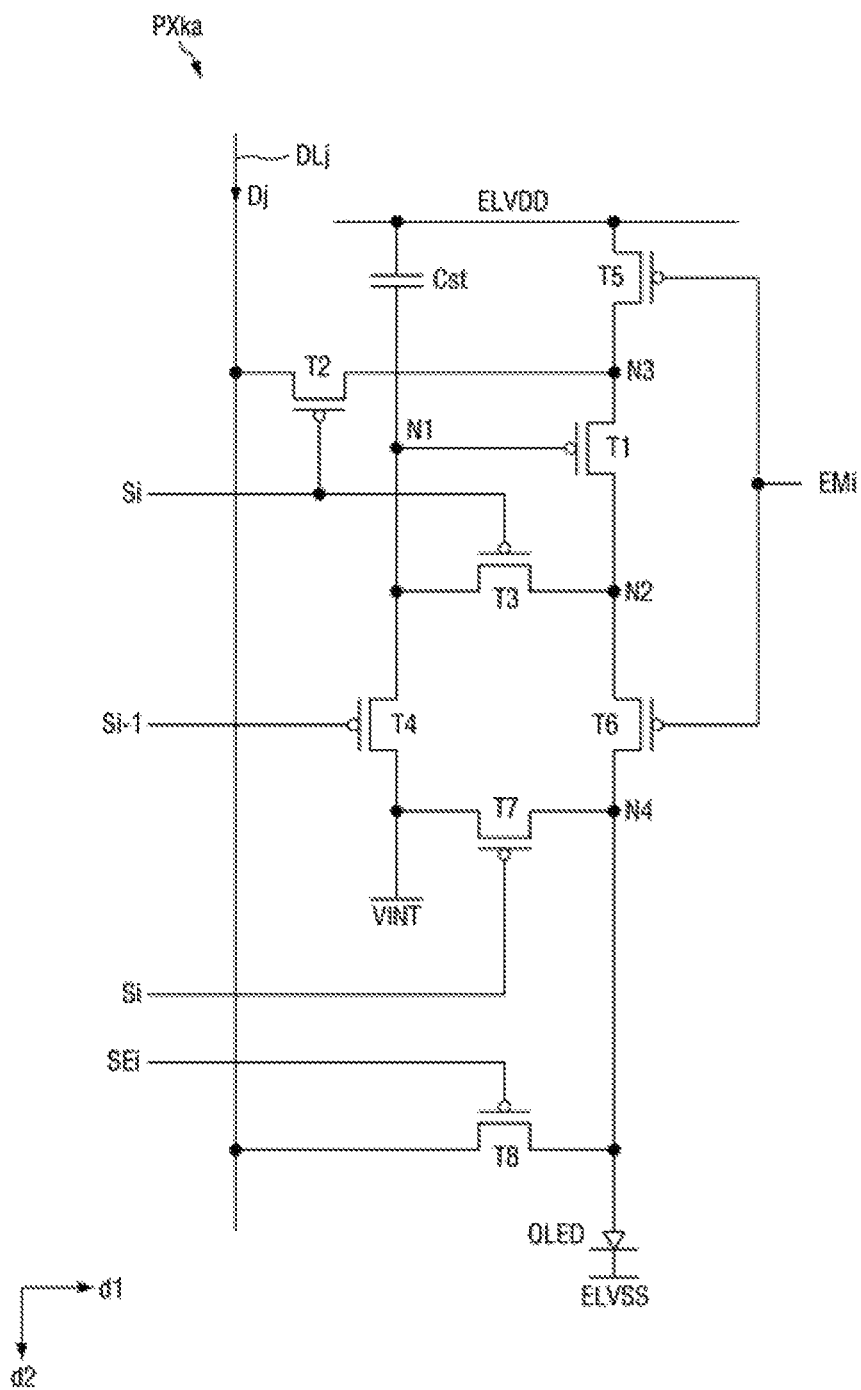
FIGS. 22 and 23 are views for explaining an organic light emitting display device according to another embodiment of the present invention.
Figure 23:
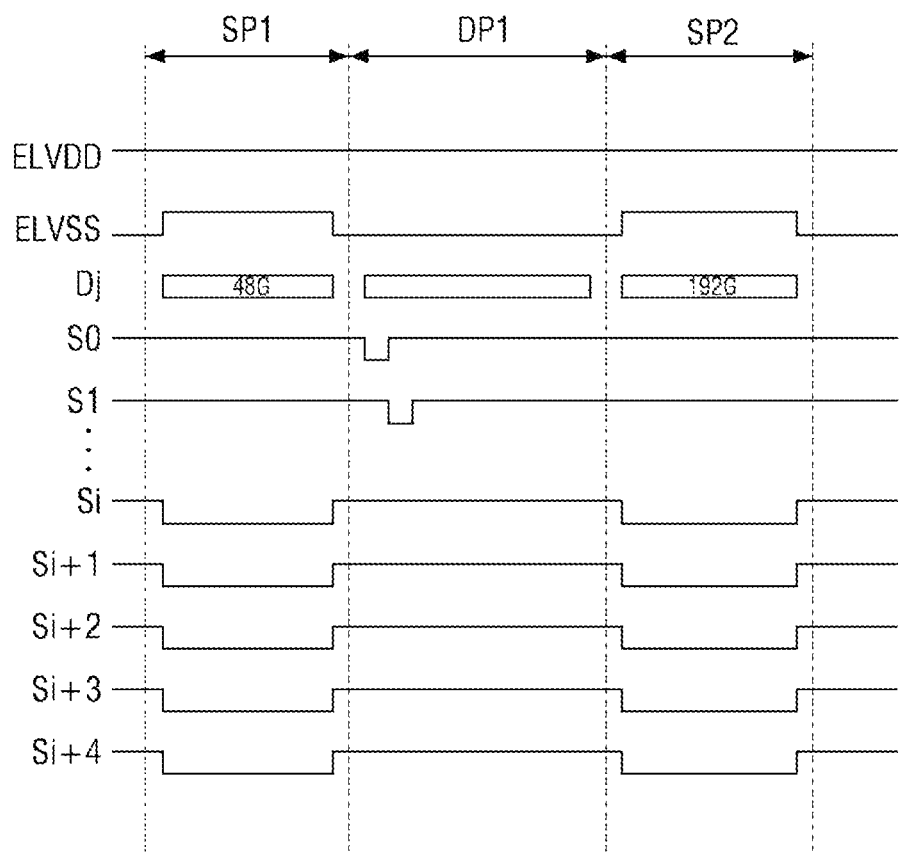

FIGS. 22 and 23 are views for explaining an organic light emitting display device according to another embodiment of the present invention. However, contents overlapping those having been described with reference to FIGS. 19 to 21 will not be repeated.

Referring to FIGS. 22 and 23, the ka-th pixel PXka does not include the ninth transistor T9. Further, the fifth transistor T5 and the sixth transistor T6 may receive the same i-th light emission control signal EMi, and the fifth transistor T5 may receive the driving voltage ELVDD having a constant voltage level.

That is, the organic light emitting display device according to another embodiment of the present invention allows the sensing data SDATA output from the ADC 132b to have a constant digital value by using the capacitance value of the feedback capacitor 132a2 and the number of pixel rows where a pixel in which the eighth transistor T8 is turned on is located, thereby omitting the ninth transistor T9.

Figure 24:
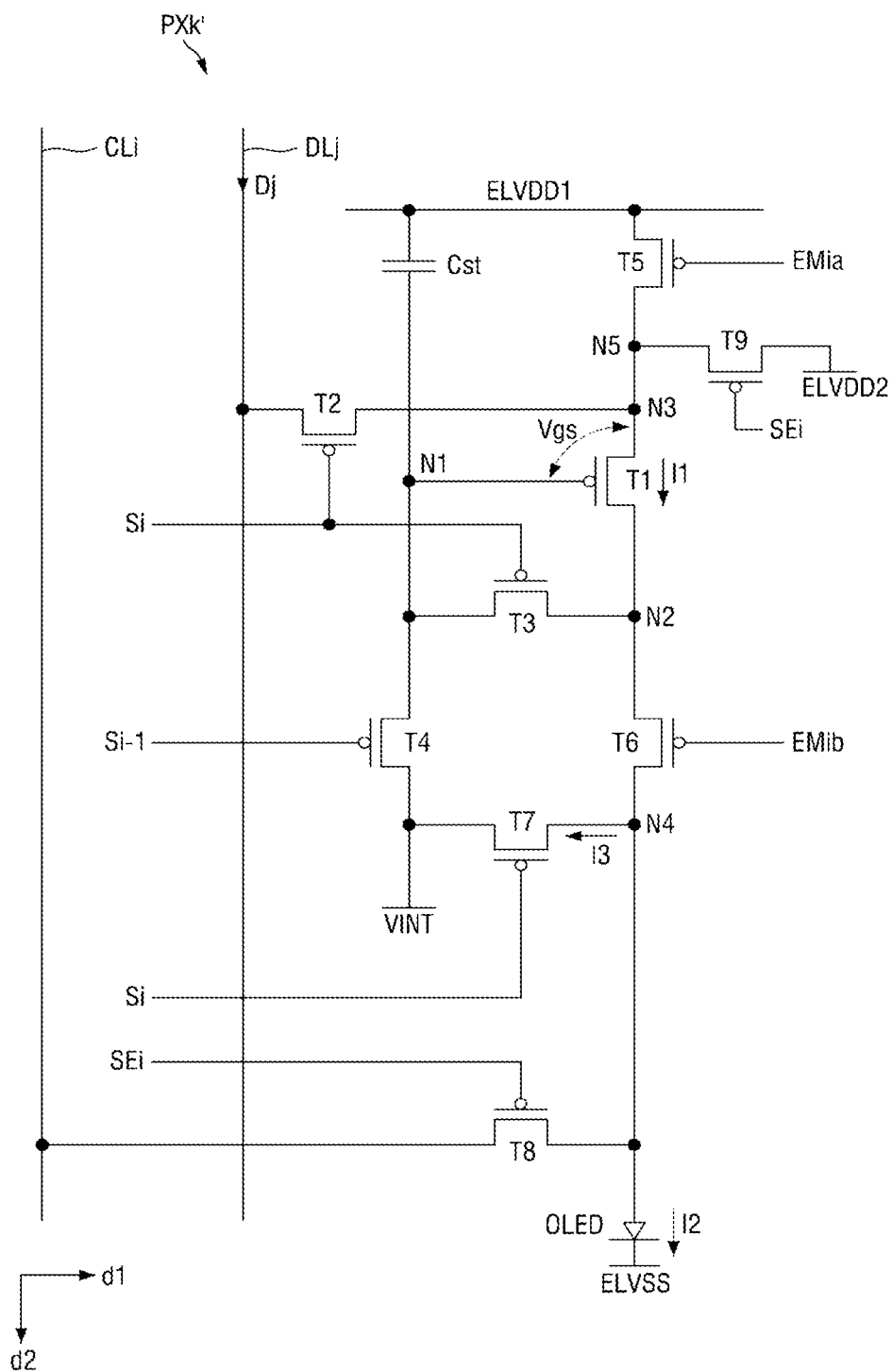
FIG. 24 is an equivalent circuit diagram illustrating an organic light emitting display device according to still another embodiment of the present invention.

FIG. 24 is an equivalent circuit diagram illustrating an organic light emitting display device according to still another embodiment of the present invention. However, contents overlapping those having been described with reference to FIGS. 1 to 23 will not be repeated.

Referring to FIG. 24, the eighth transistor T8 may be connected with a separate sensing line CLi in addition to the j-th data line DLj. The sensing line CLi is connected with the sensing unit 132 (refer to FIG. 4). In this case, the switch bank 133 may be omitted.

Meanwhile, hysteresis measurement is not necessarily performed in only one pixel or one pixel row including the pixel within the corresponding frame. For example, hysteresis measurement may be performed simultaneously on the plurality of pixels. Further, within the corresponding frame in which compensation data is provided, the hysteresis compensation and the hysteresis measurement of another pixel may be performed at the same time.

Further, the plurality of pixels PX (refer to FIG. 1) may not necessarily include all nine transistors. For example, with reference to the k-th pixel PXk (refer to FIG. 2), the k-th pixel PXk may include only the first transistor T1, the second transistor T2, the fifth transistor T5, the eighth transistor T8, and the ninth transistor T9. In this case, the drain electrode of the second transistor T2 may be directly connected with the gate electrode of the first transistor T1.

As described above, according to the embodiments of the present invention, a hysteresis characteristic can be measured in real time during a period displaying an image. Further, the accuracy of hysteresis characteristics can be improved.

The effects and aspects of the described embodiments of the present invention are not limited by the foregoing, and other various effects are anticipated herein.

Although the preferred embodiments of the present invention have been disclosed for illustrative purposes, those skilled in the art will appreciate that various modifications, additions and substitutions are possible, without departing from the scope and spirit of the invention as disclosed in the accompanying claims, with functional equivalents thereof to be included.

What is claimed is:

1. An organic light emitting display device, comprising:
a driving transistor having one electrode connected with a node, and another electrode connected with an organic light emitting element;
a first control transistor for receiving a first driving voltage through one electrode, and having another electrode connected with the node;
a second control transistor for receiving a second driving voltage through one electrode, and having another electrode connected with the node;
a third control transistor having one electrode connected with the driving transistor, and having another electrode connected with the organic light emitting element;
a sensing transistor having one electrode connected between the another electrode of the driving transistor and the organic light emitting element; and
a scan transistor having one electrode connected with a data line, a gate electrode connected with a scan line, and another electrode connected with the driving transistor,
wherein the sensing transistor is turned on in a sensing period, the first control transistor is turned off in the sensing period, the second control transistor is turned on in the sensing period, and the third control transistor is turned on in the sensing period,
wherein the scan transistor is configured to be turned on in a first period and in a second period subsequent to the first period during an active section of one frame, and
wherein the sensing period is between the first period and the second period.

2. The organic light emitting display device of claim 1, wherein the one electrode of the third control transistor is connected with the another electrode of the driving transistor.

3. The organic light emitting display device of claim 1, wherein a gate electrode of the sensing transistor and a gate electrode of the second control transistor are configured to receive a same sensing signal.

4. The organic light emitting display device of claim 1, wherein another electrode of the sensing transistor is connected with the data line.

5. The organic light emitting display device of claim 1, wherein the another electrode of the scan transistor is connected with the node.

6. The organic light emitting display device of claim 1, further comprising a compensation transistor having one electrode connected with the driving transistor, another electrode connected with a gate electrode of the driving transistor, and a gate electrode connected with the gate electrode of the scan transistor.

7. An organic light emitting display device, comprising:
a display unit in which a first pixel is located, the first pixel comprising a driving transistor, a first control transistor, a second control transistor, a third control transistor, a sensing transistor, and an organic light emitting element;
a power supply unit connected with a first driving voltage line connected to one electrode of the first control transistor, and a second driving voltage connected to one electrode of the second control transistor; and
a scan transistor having one electrode connected with a data line, another electrode connected with a node, and a gate electrode connected with a scan line,
wherein the driving transistor has one electrode connected with the node, and another electrode connected with the organic light emitting element through the third control transistor,
wherein another electrode of the first control transistor and another electrode of the second control transistor are connected with the node,
wherein the sensing transistor, the third control transistor, and the second control transistor are configured to be turned on, and the first control transistor is configured to be turned off, in a sensing period,
wherein the scan transistor is configured to be turned on in a first period and in a second period subsequent to the first period during an active section of one frame, and
wherein the sensing period is between the first period and the second period.

8. The organic light emitting display device of claim 7, wherein the sensing transistor and the second control transistor perform a switching operation in a same manner.

9. The organic light emitting display device of claim 7, wherein the sensing period is in the active section in which an image is displayed in the one frame.

10. The organic light emitting display device of claim 7, wherein a data signal provided to the one electrode of the scan transistor through the data line during the first period is different from a data signal provided to the one electrode of the scan transistor through the data line during the second period.

11. The organic light emitting display device of claim 7, further comprising a data driver connected with the one electrode of the scan transistor through the data line.

12. An organic light emitting display device, comprising:
a scan transistor having one electrode connected with a data line, another electrode connected with a node, and a gate electrode connected with a scan line;
a driving transistor having one electrode connected with the node and another electrode connected with an organic light emitting element;
a first control transistor receiving a first driving voltage through one electrode, and having another electrode connected with the node;
a second control transistor receiving a second driving voltage through one electrode, and having another electrode connected with the node;
a third control transistor having one electrode connected with the driving transistor, and having another electrode connected with the organic light emitting element; and
a sensing transistor having one electrode connected with the data line, and another electrode connected with the organic light emitting element,
wherein the sensing transistor is configured to perform a switching operation complementarily with the first control transistor in a sensing period, and is configured to perform the switching operation in a same manner as the second control transistor
wherein the sensing transistor and the third control transistor are configured to be turned on in the sensing period,
wherein the scan transistor is turned on in a first period and a second period subsequent to the first period during an active section of one frame,
wherein the sensing period is between the first period and the second period, and
wherein the sensing period, the first period, and the second period are comprised in the one frame.

13. The organic light emitting display device of claim 12, wherein the first control transistor is configured to be turned off three times during one frame, and the second control transistor is configured to be turned off two times during one frame.

14. The organic light emitting display device of claim 12, wherein the sensing period is in the active section in which an image is displayed in the one frame.

\* \* \* \* \*